(12) United States Patent
Cordes

(10) Patent No.: US 11,591,842 B2
(45) Date of Patent: *Feb. 28, 2023

(54) MODULAR SHIELDED ENCLOSURES AND RELATED METHODS USING GLIDABLE SHIELDED WALLS

(71) Applicant: Marc Cordes, Arlington, VA (US)

(72) Inventor: Marc Cordes, Arlington, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/404,831

(22) Filed: Aug. 17, 2021

(65) Prior Publication Data

US 2022/0120129 A1    Apr. 21, 2022

Related U.S. Application Data

(63) Continuation of application No. 16/033,043, filed on Jul. 11, 2018, now Pat. No. 11,118,393.

(60) Provisional application No. 62/531,312, filed on Jul. 11, 2017.

(51) Int. Cl.
| | |
|---|---|
| H05K 9/00 | (2006.01) |
| E05G 1/026 | (2006.01) |
| E06B 5/20 | (2006.01) |
| E06B 5/10 | (2006.01) |
| F41H 5/013 | (2006.01) |
| E05D 15/06 | (2006.01) |
| E06B 3/46 | (2006.01) |
| E06B 7/23 | (2006.01) |
| F41H 5/24 | (2006.01) |
| E06B 5/18 | (2006.01) |
| F41H 5/04 | (2006.01) |

(52) U.S. Cl.
CPC ......... *E05G 1/026* (2013.01); *E05D 15/0604* (2013.01); *E06B 3/4672* (2013.01); *E06B 5/10* (2013.01); *E06B 5/18* (2013.01); *E06B 5/20* (2013.01); *E06B 7/2301* (2013.01); *E06B 7/2314* (2013.01); *E06B 7/2318* (2013.01); *F41H 5/013* (2013.01); *F41H 5/24* (2013.01); *H05K 9/0003* (2013.01); *E05Y 2900/132* (2013.01); *F41H 5/04* (2013.01)

(58) Field of Classification Search
CPC .................................................. H05K 9/0003
See application file for complete search history.

(56) References Cited

U.S. PATENT DOCUMENTS

| | | | | |
|---|---|---|---|---|
| 4,399,317 A | * | 8/1983 | Van Dyk, Jr. | H05K 9/0015 174/370 |
| 4,525,595 A | * | 6/1985 | Harriman | H05K 9/0016 174/364 |
| 4,746,765 A | * | 5/1988 | Mallott | H05K 9/0015 49/477.1 |
| 5,225,631 A | * | 7/1993 | Lee | H05K 9/0015 277/653 |
| 5,335,464 A | * | 8/1994 | Vanesky | H05K 9/0001 174/374 |
| 5,353,029 A | * | 10/1994 | Johnston | H01Q 17/00 342/4 |
| 7,456,365 B2 | * | 11/2008 | Gilliland | F16J 15/064 277/646 |

(Continued)

*Primary Examiner* — Hung V Ngo
(74) *Attorney, Agent, or Firm* — Capital Patent & Trademark Law Firm, PLLC

(57) ABSTRACT

Lightweight, glidable shielded components (e.g. doors) may be used in conjunction with accredited enclosures to provide electromagnetic, acoustic and CBR protection.

18 Claims, 34 Drawing Sheets

(56) References Cited

U.S. PATENT DOCUMENTS

| | | | | |
|---|---|---|---|---|
| 11,118,393 B2 * | 9/2021 | Cordes | ............... | E06B 7/2314 |
| 2007/0007037 A1 * | 1/2007 | Diaferia | ............... | H05K 9/0015 |
| | | | | 174/382 |
| 2007/0084126 A1 * | 4/2007 | Hautmann | ............... | E06B 5/18 |
| | | | | 49/483.1 |
| 2013/0194772 A1 * | 8/2013 | Rojo | ............... | H04Q 1/066 |
| | | | | 29/407.01 |
| 2016/0302332 A1 * | 10/2016 | Anderson | ............... | H05K 9/0003 |
| 2017/0234055 A1 * | 8/2017 | Ottmann | ............... | E05F 15/643 |
| | | | | 49/31 |

* cited by examiner

Iso View

Close-Up View

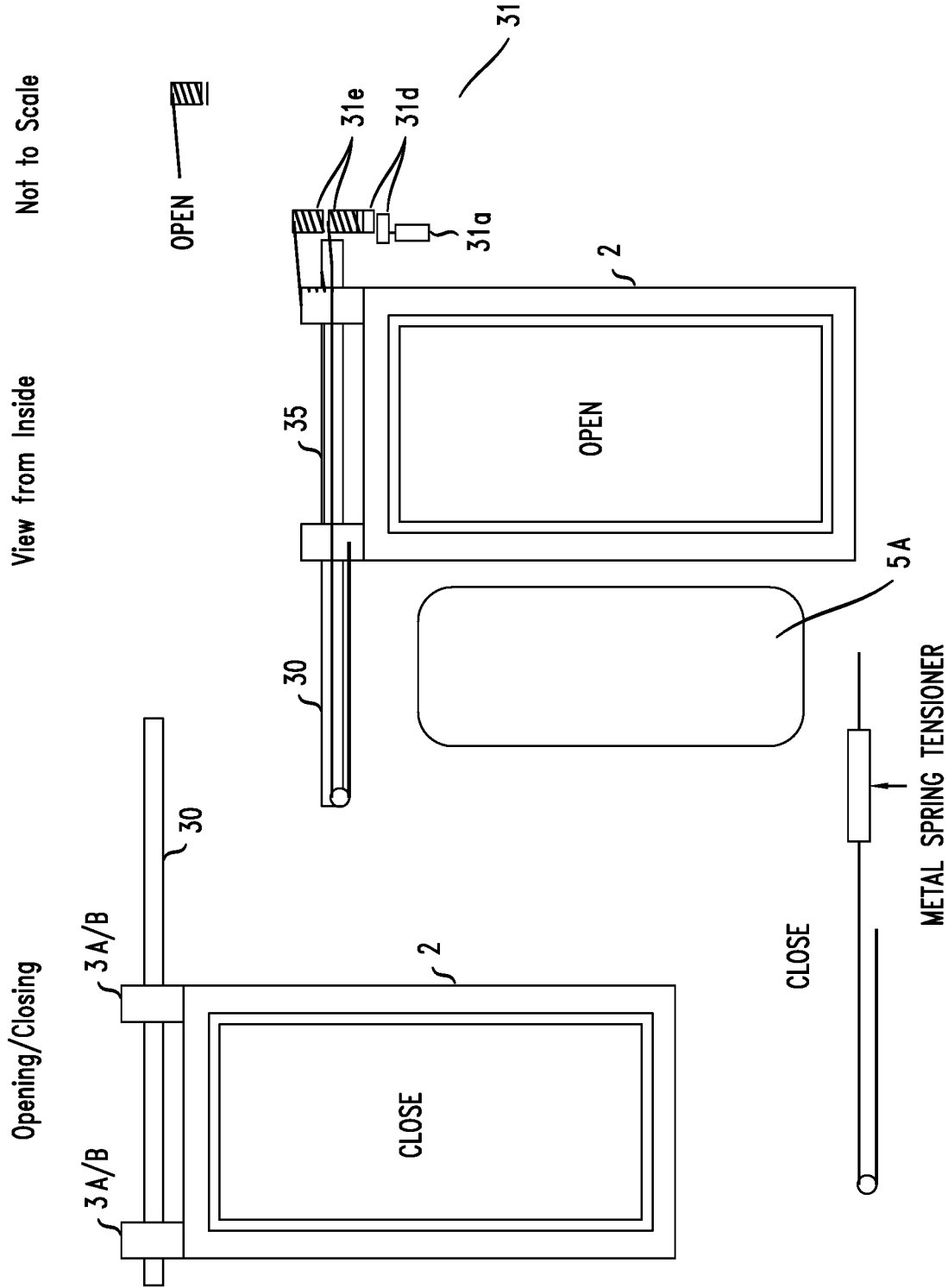

Roller Assembly

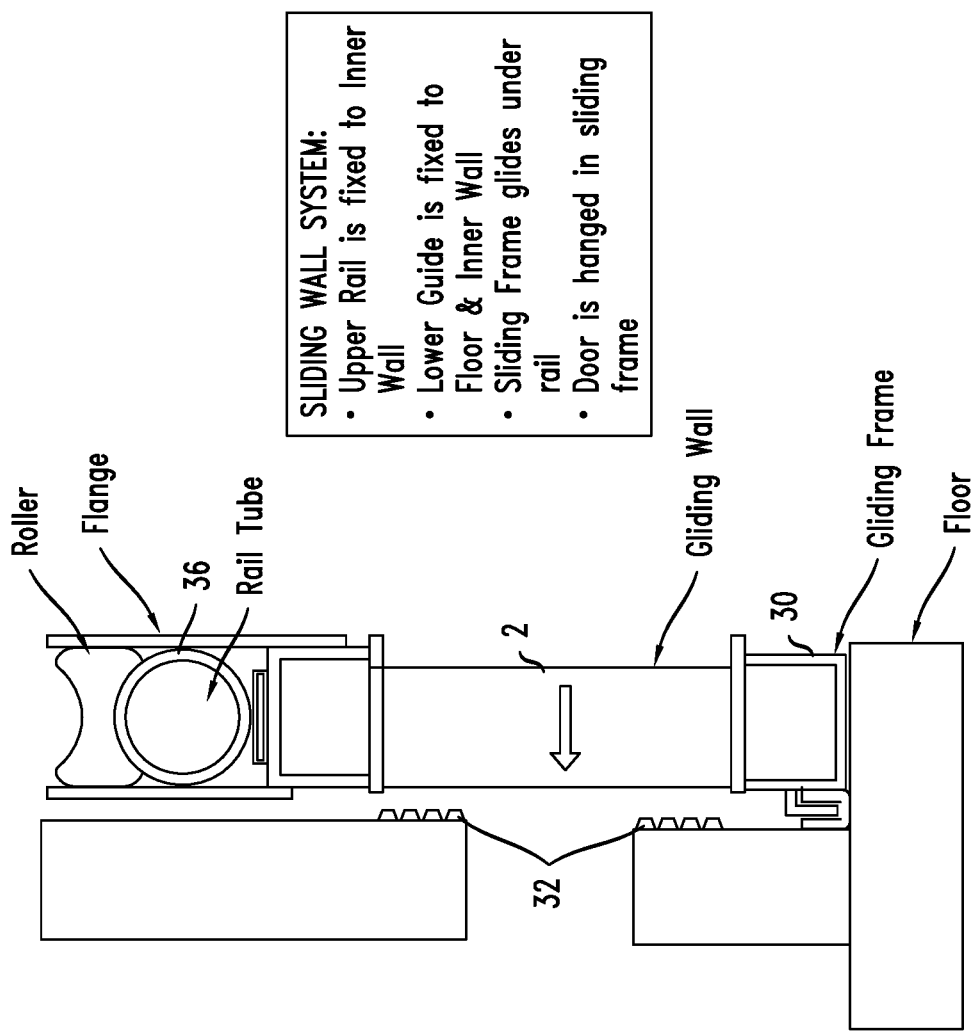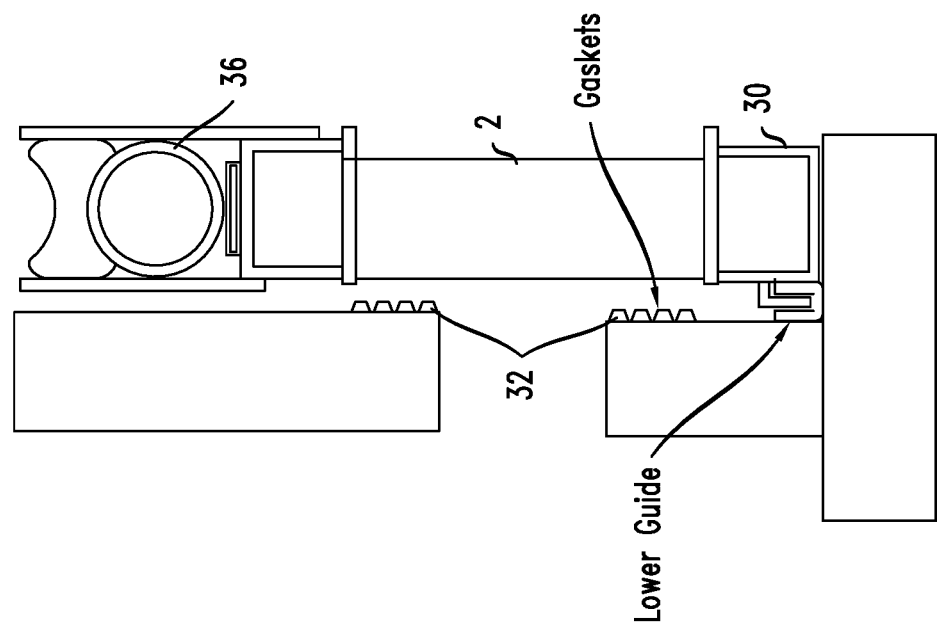

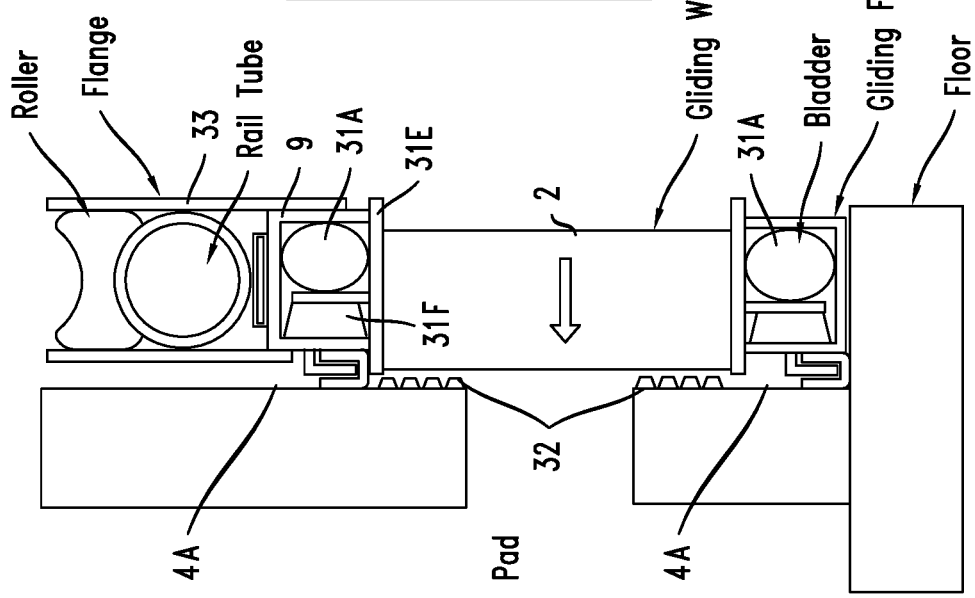
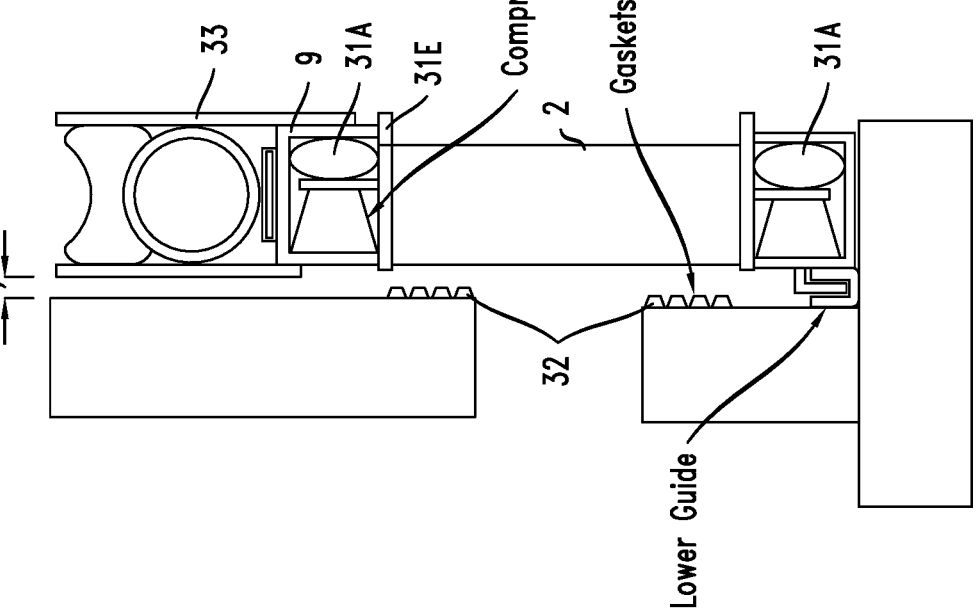

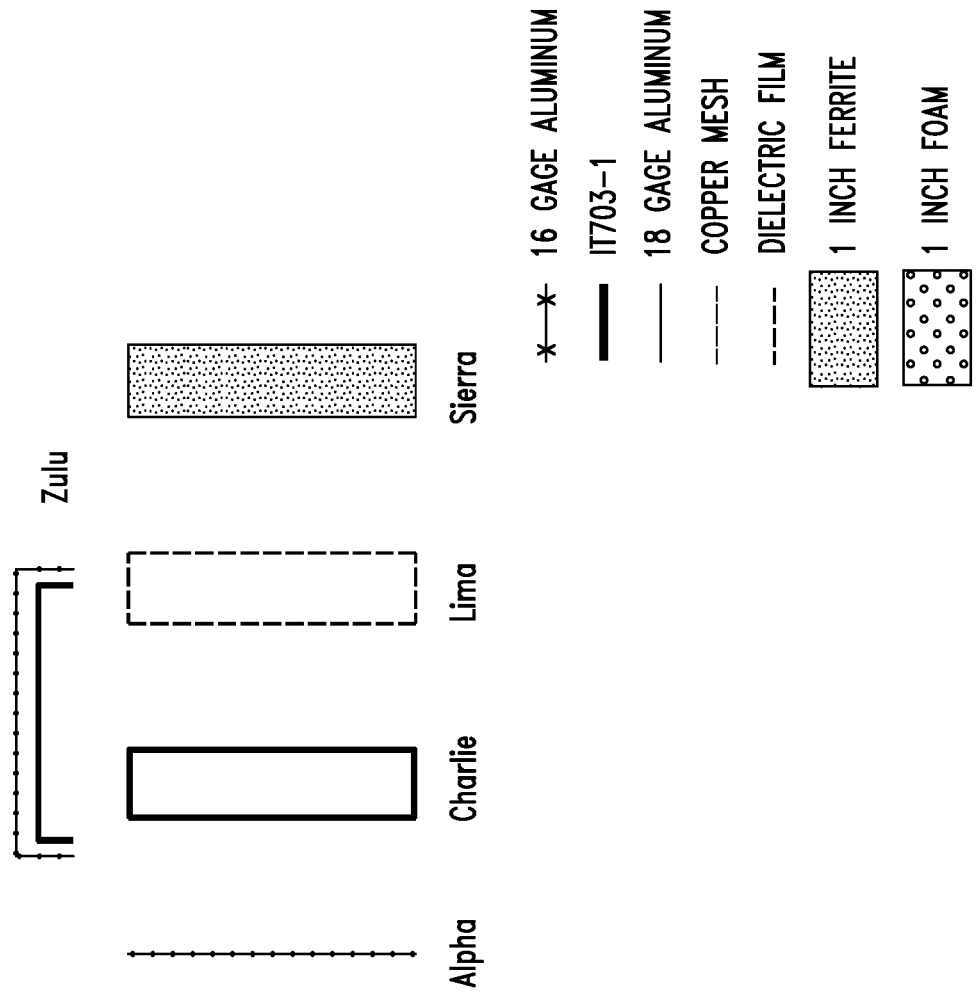

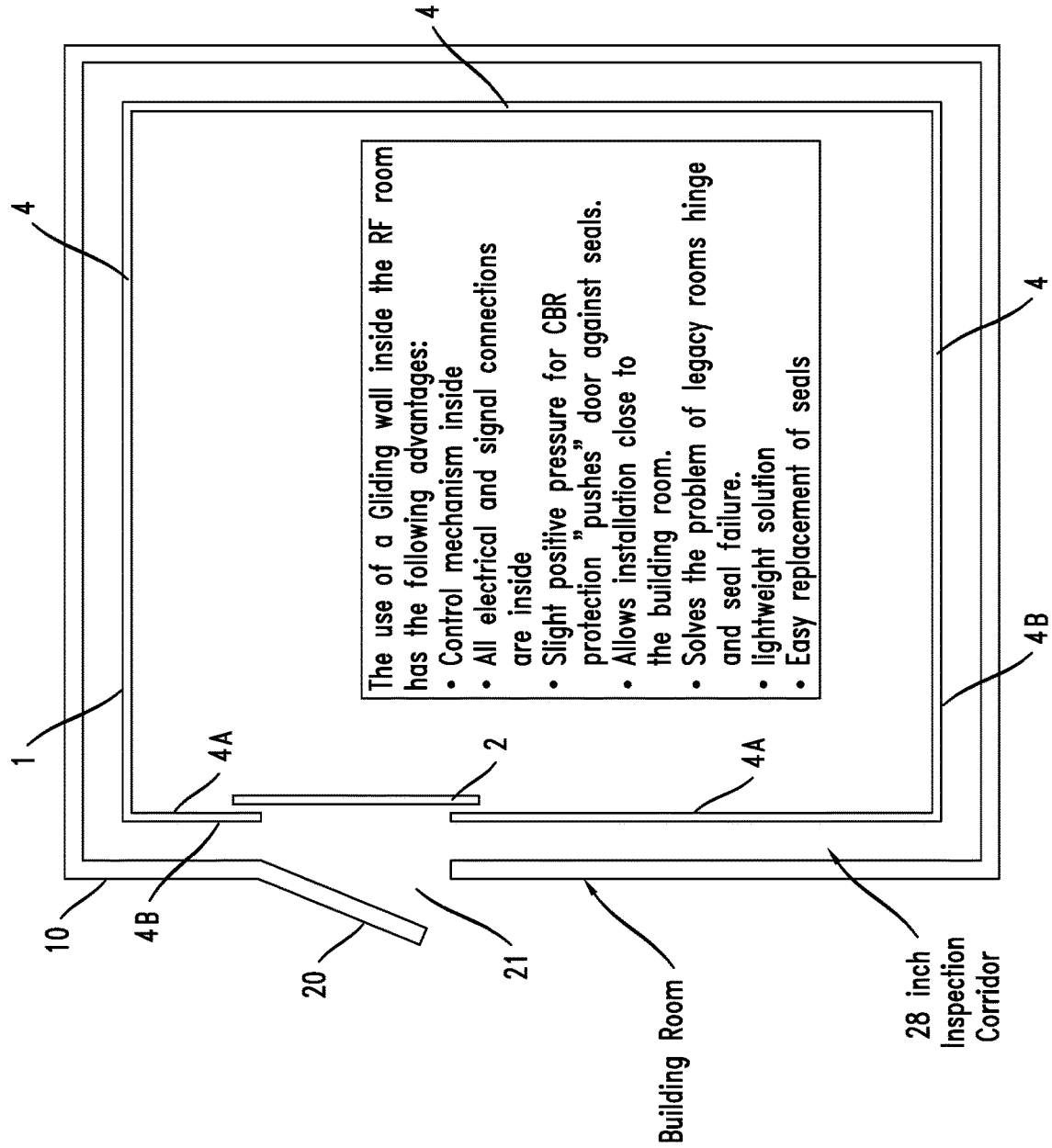

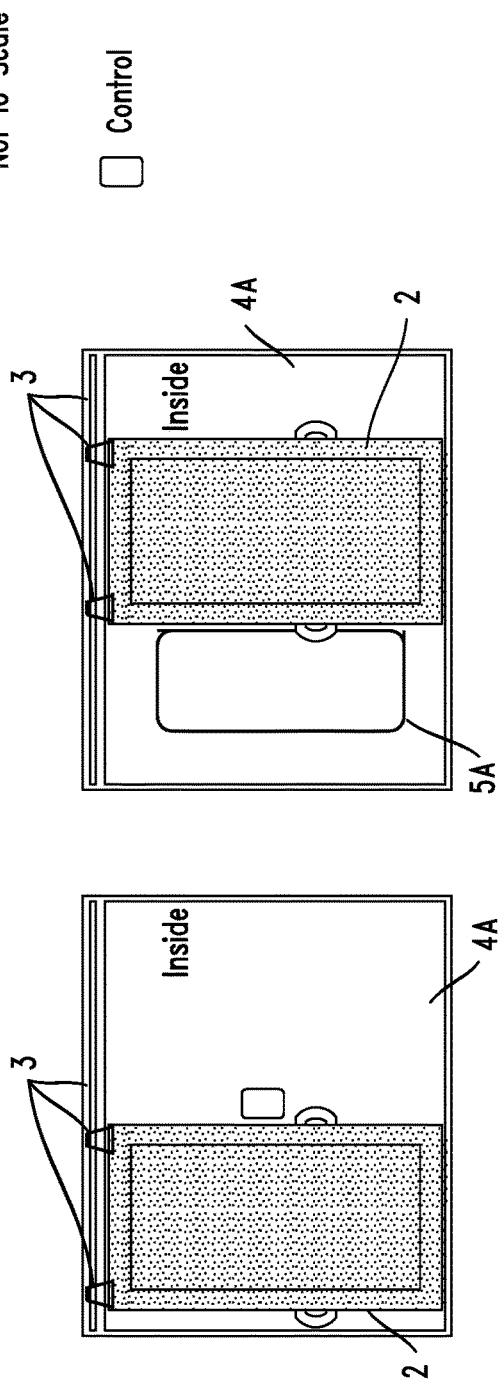
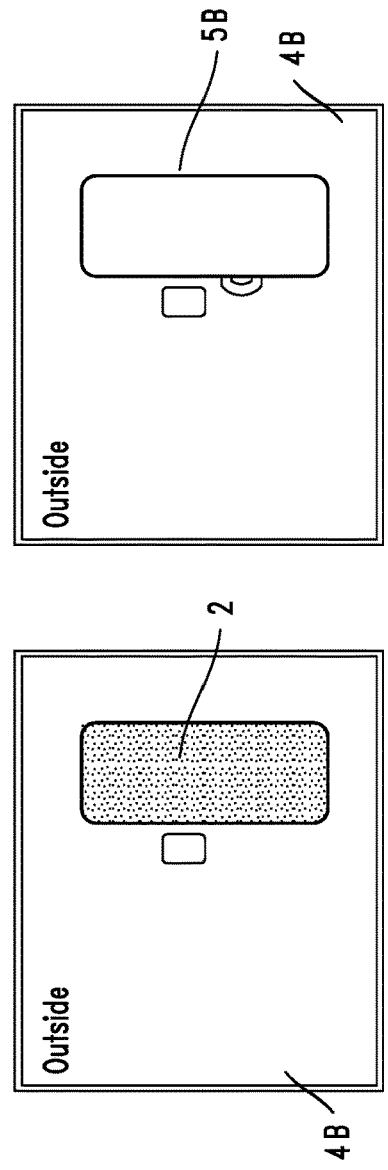
Opening and Closing
FIG. 3A
FIG. 3B
Door and its complete mechanism and controls are inside enclosure; it makes the modification by enemy much more difficult

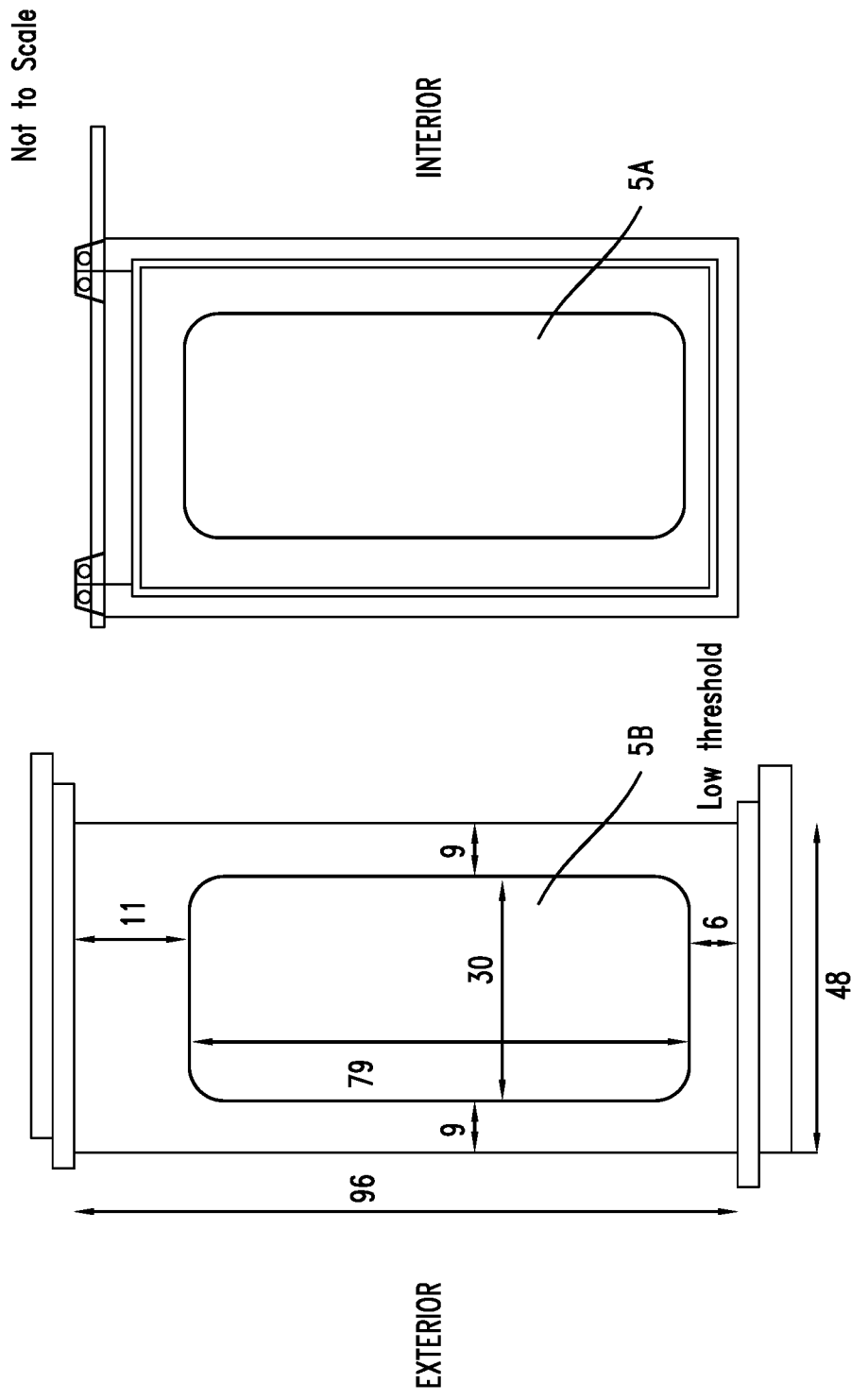

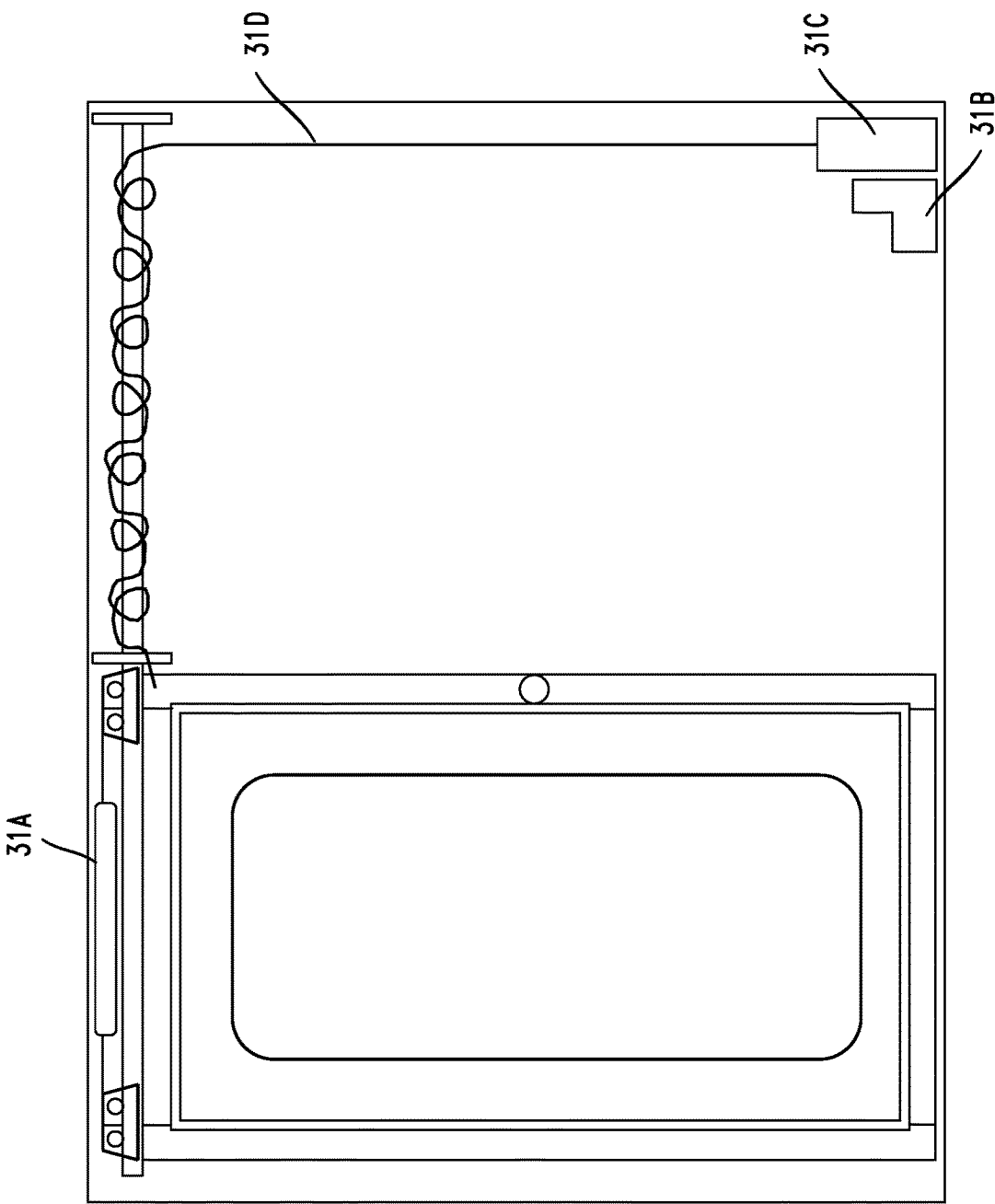

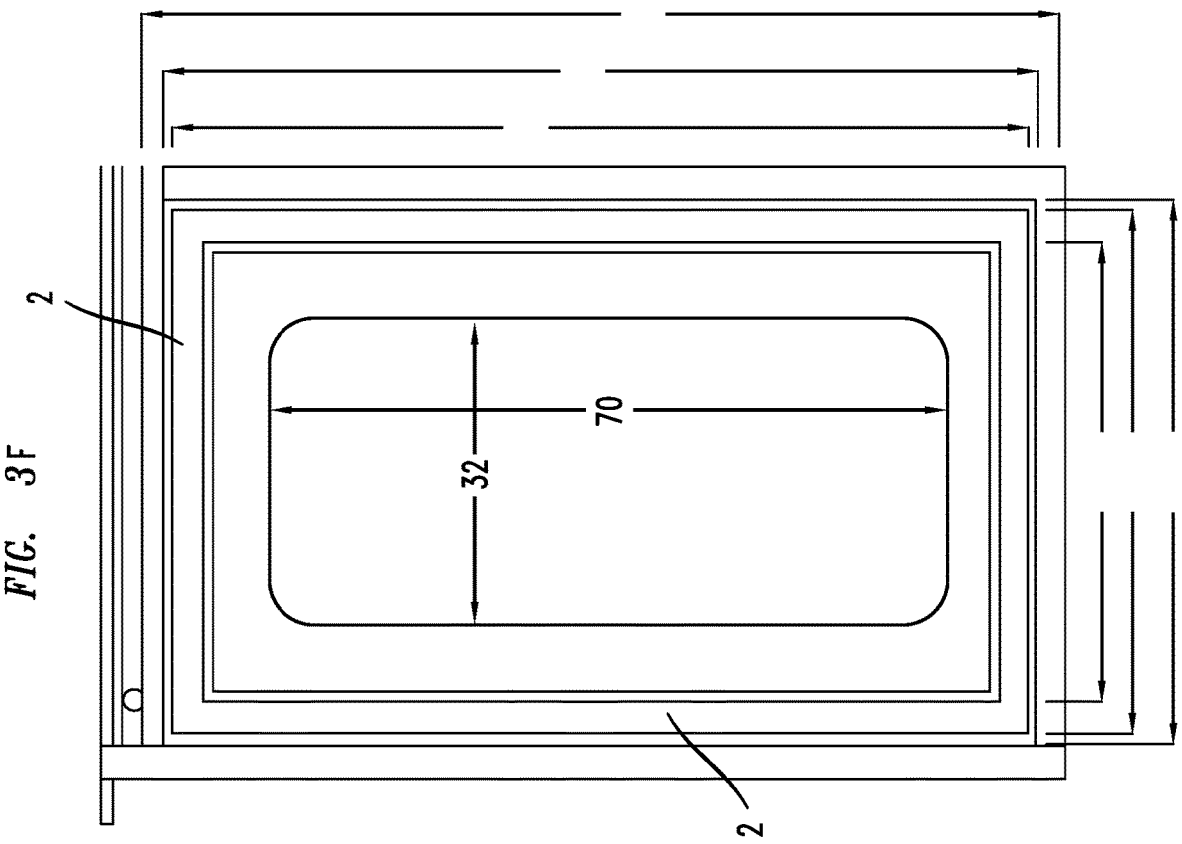

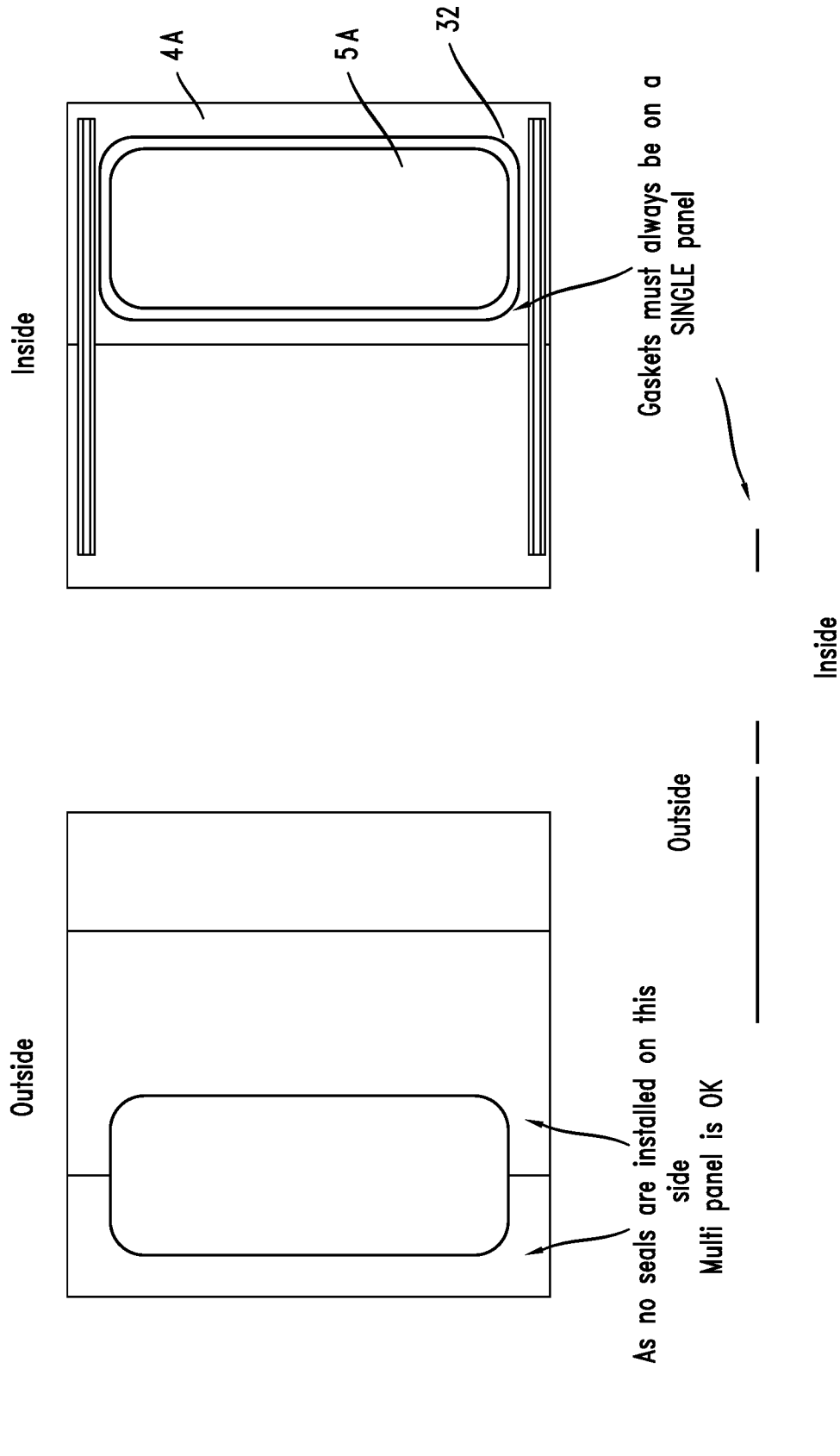

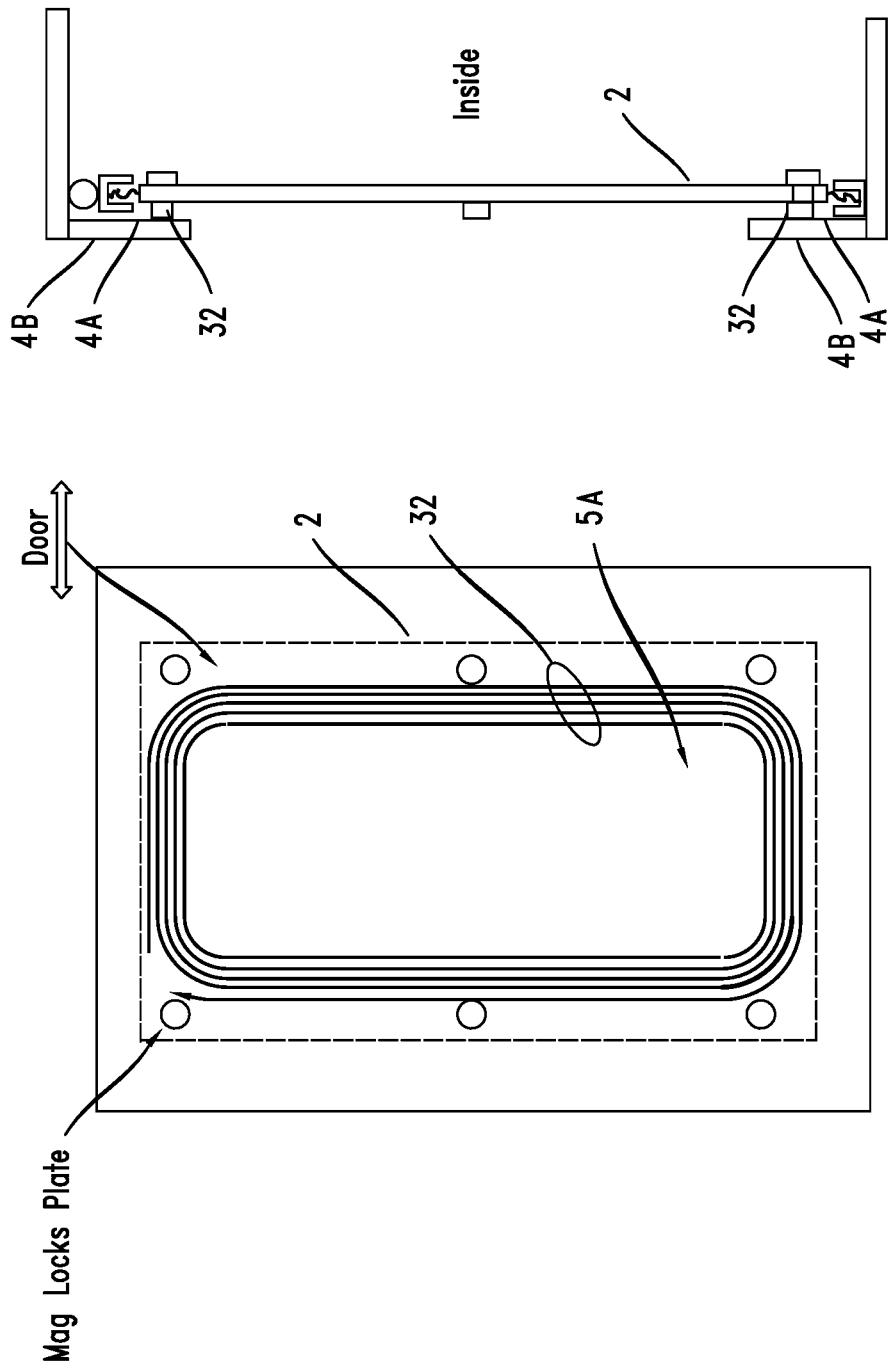

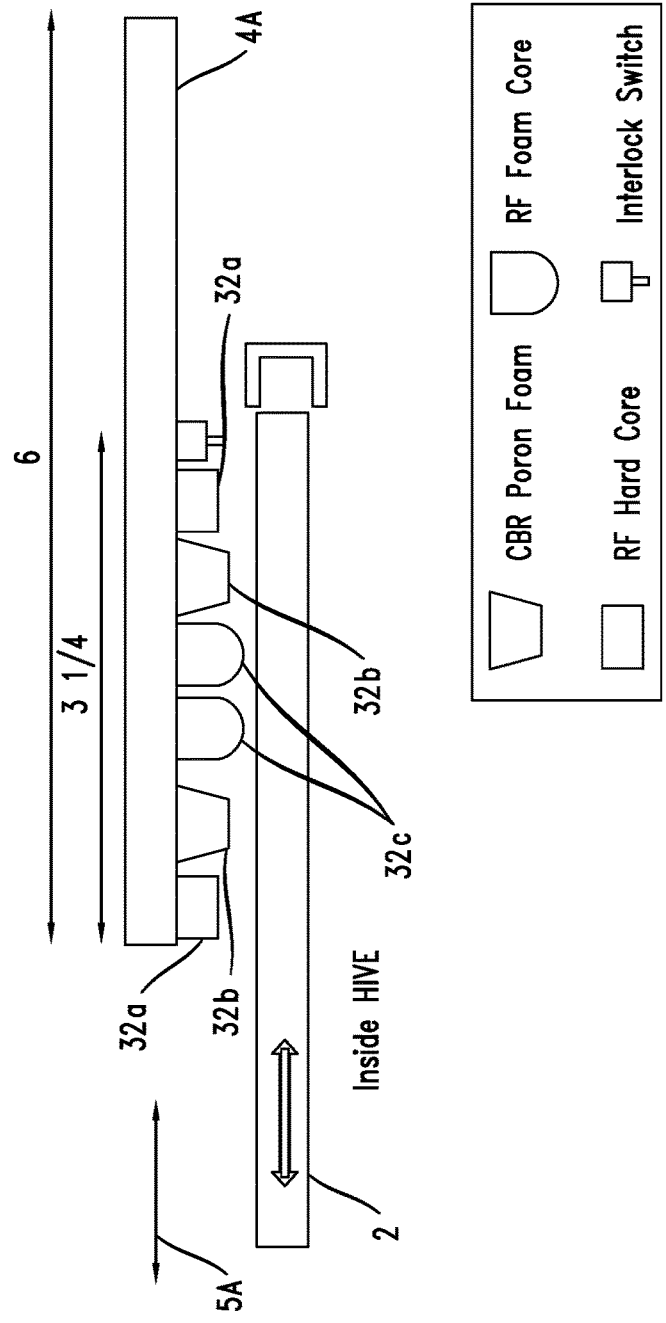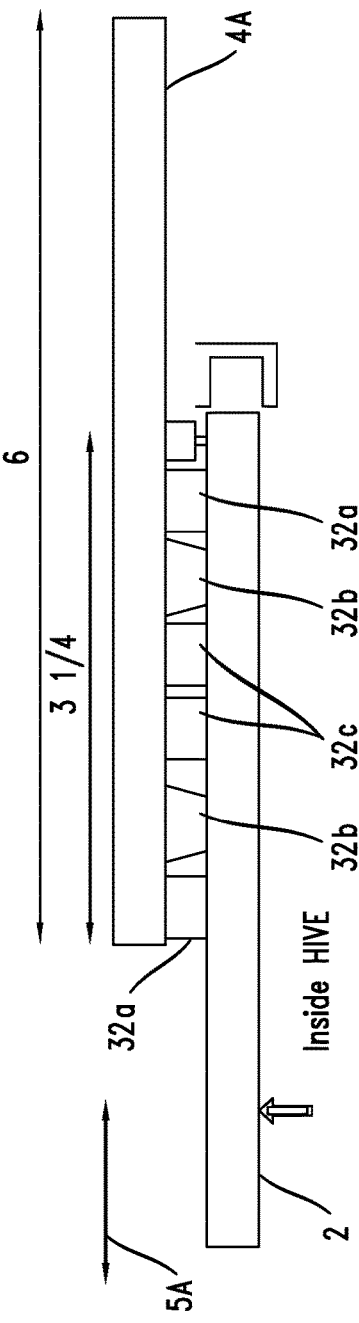

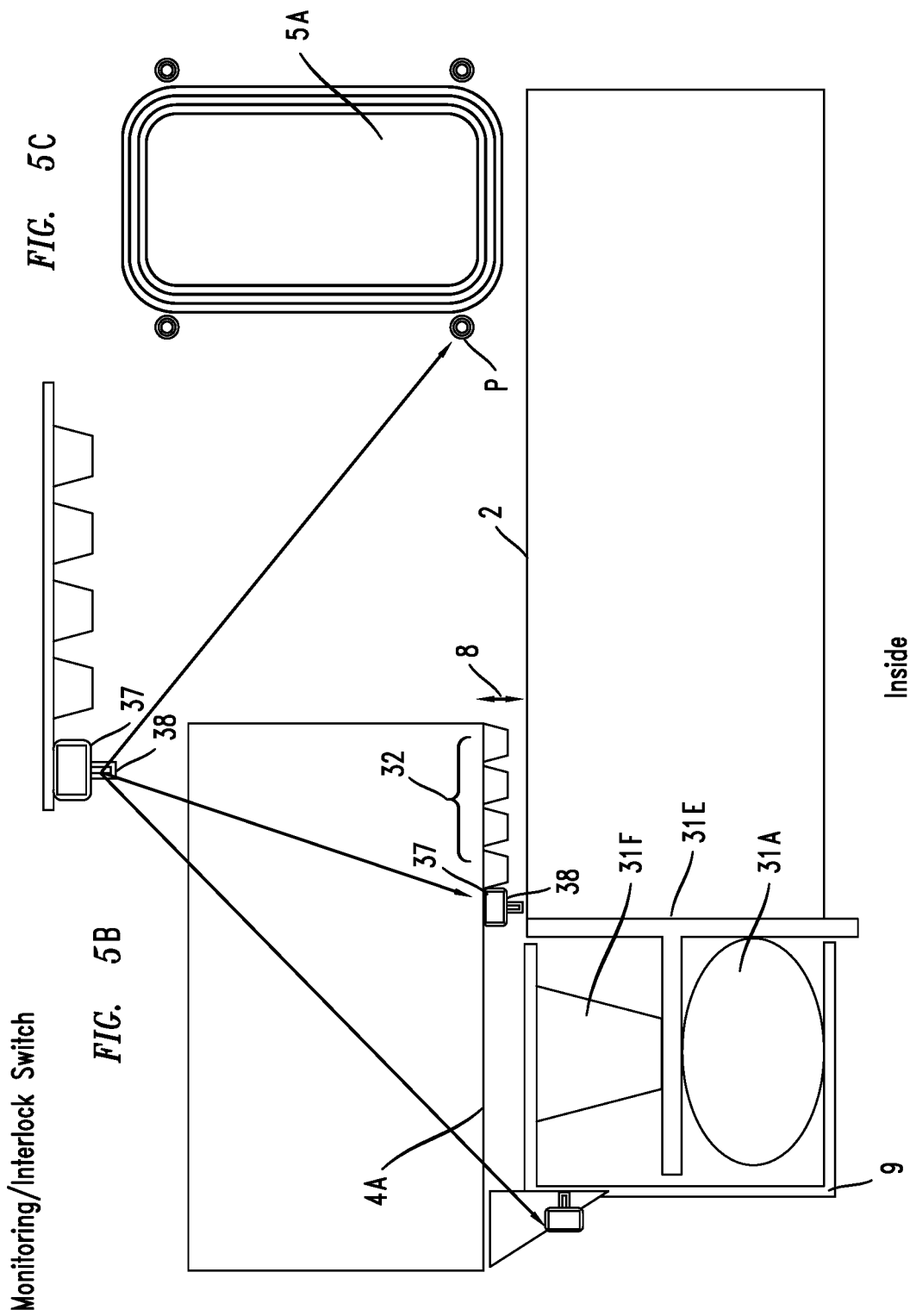

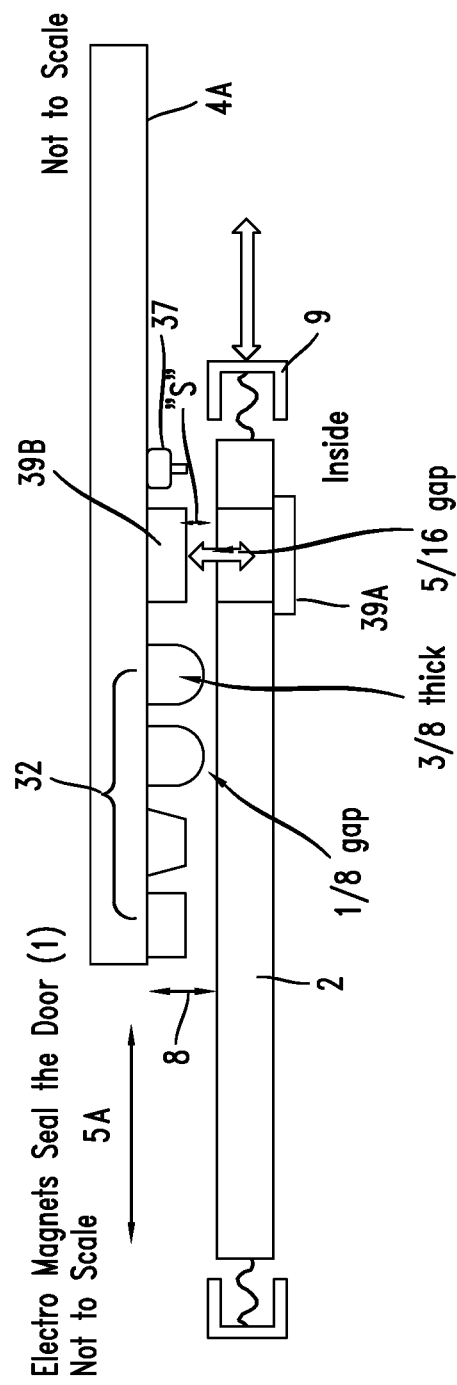
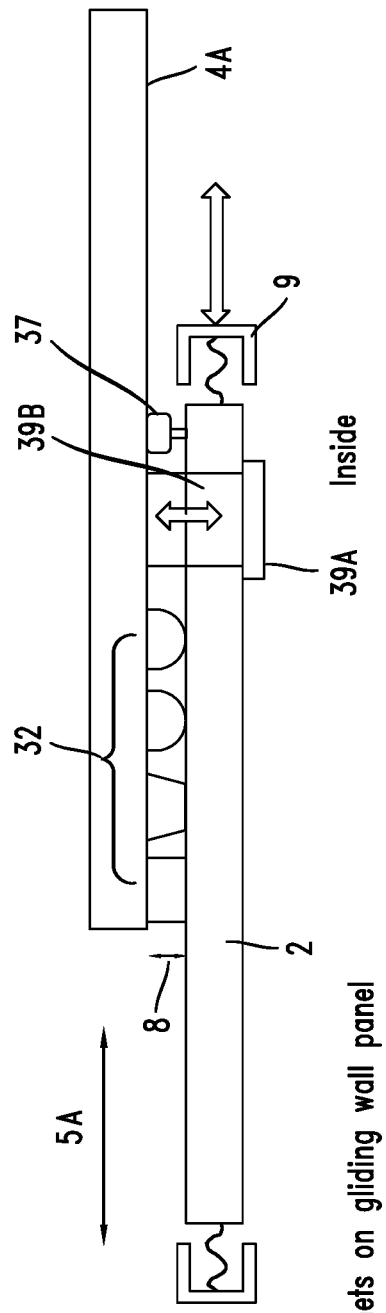

Not to Scale

Electro Magnets to seal the Door

Magnets within the Composite Frame
- Moves the gliding wall without pulling on the fixed wall
- Main forces are within U channel
- No bolts to attach iron to enclosure wall
- Door is hanged in sliding frame
- Very clean assembly

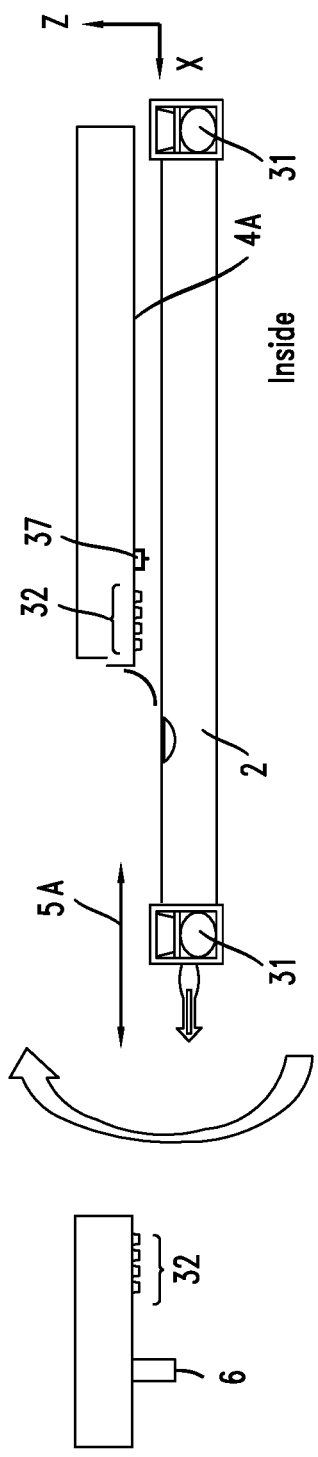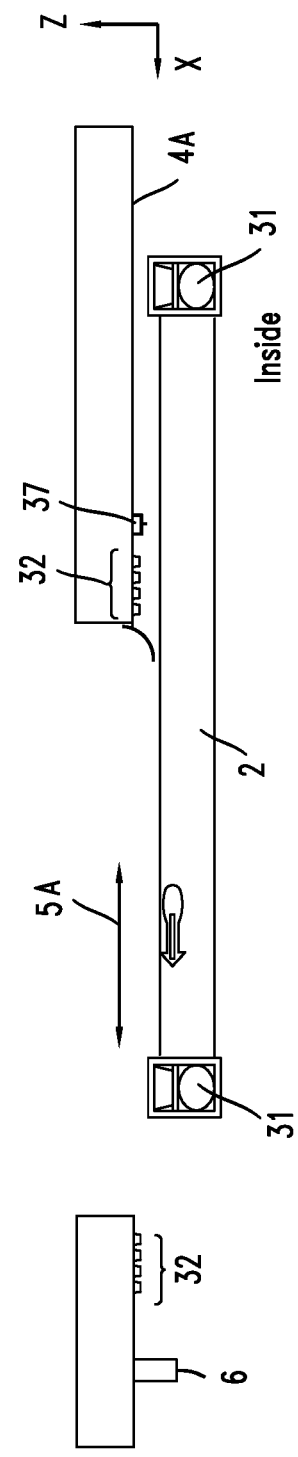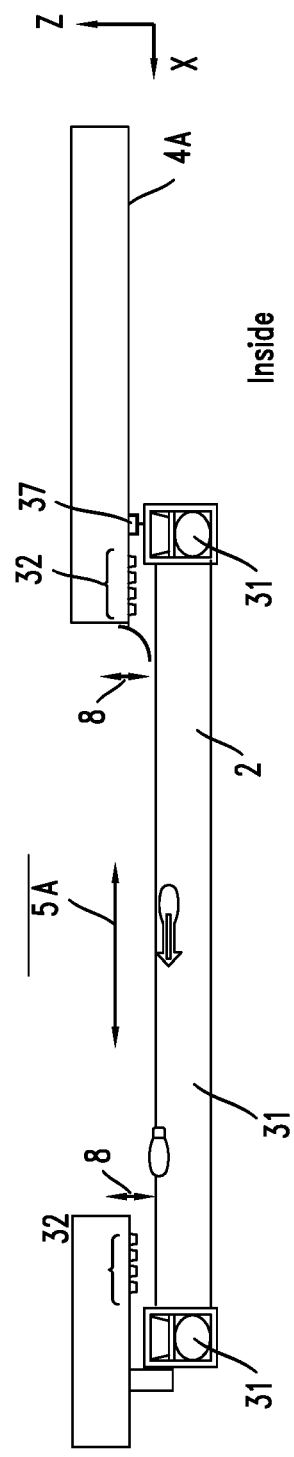

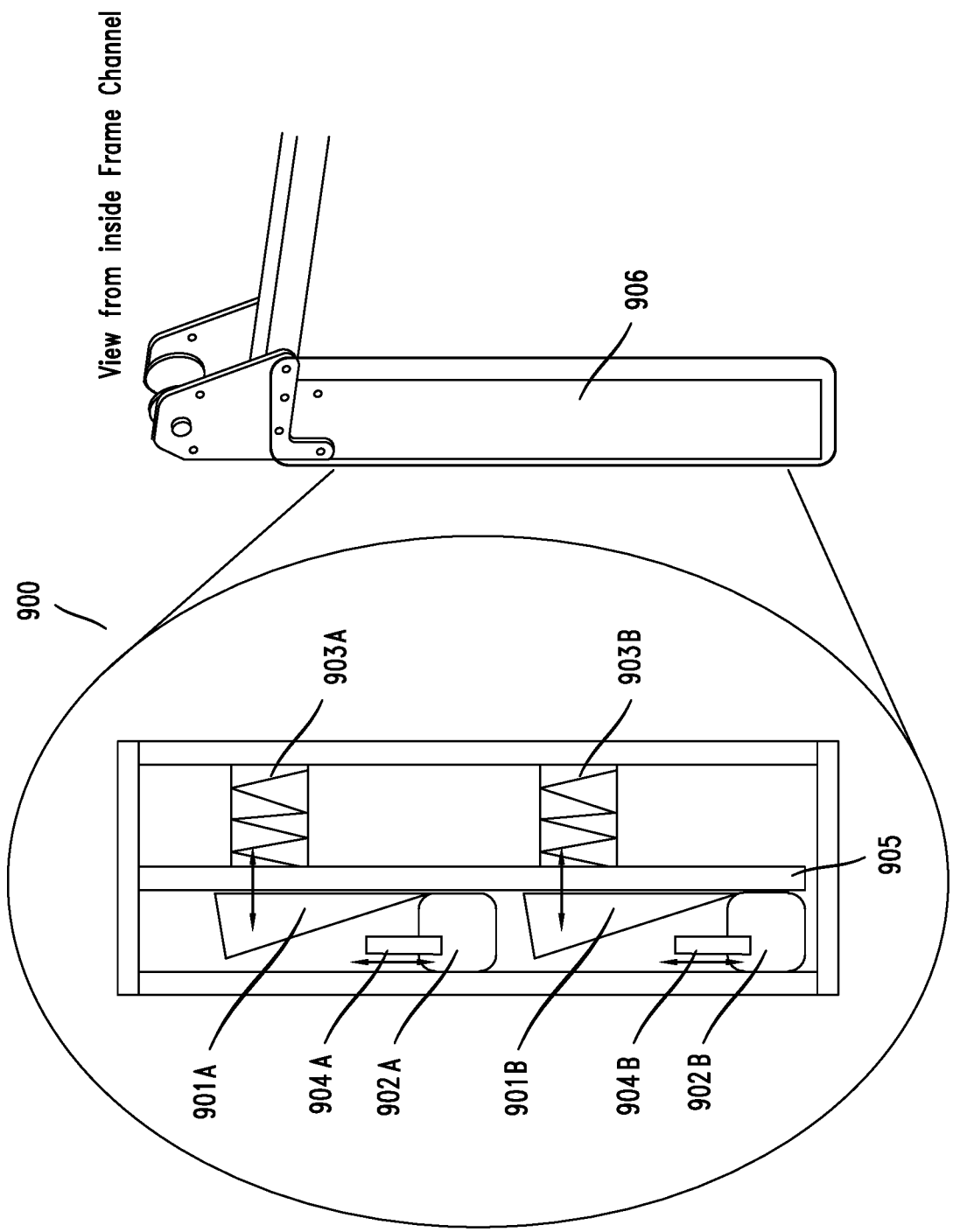

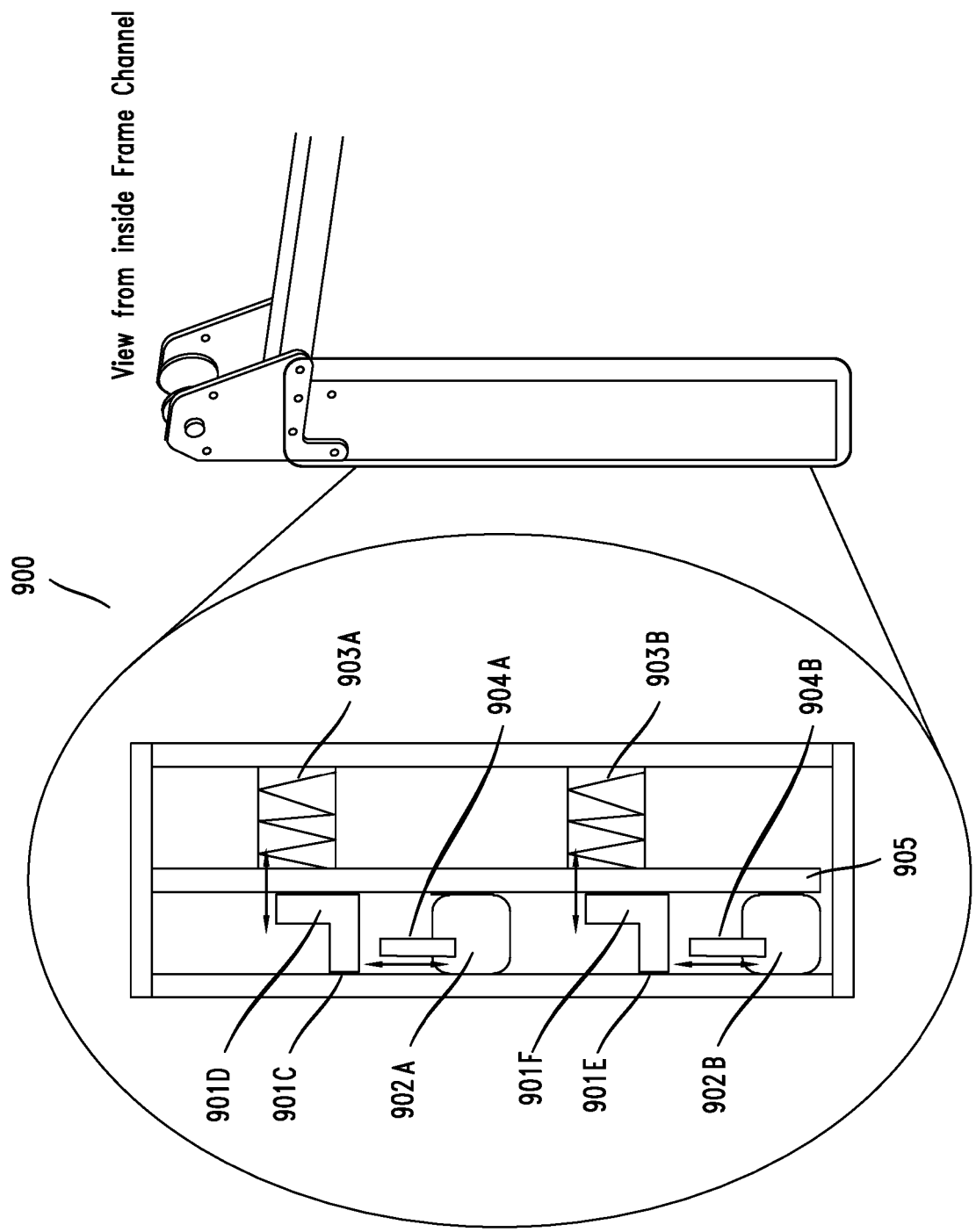

MODULAR SHIELDED ENCLOSURES AND RELATED METHODS USING GLIDABLE SHIELDED WALLS

RELATED APPLICATIONS

The present application is a continuation of U.S. patent application Ser. No. 16/033,043 filed Jul. 11, 2018 (the '043 Application). The present application incorporates by reference the entire disclosures of the '043 Application, U.S. Provisional Application No. 62/531,312 filed Jul. 11, 2017, U.S. Provisional Application No. 62/531,317 filed Jul. 11, 2017, and U.S. application Ser. No. 13/471,401 filed May 14, 2012 as if all of the above Applications were set forth in full herein.

BACKGROUND

Keeping communications secret from an adversary or competitor has been the challenge of the military, agencies of the federal government as well companies that are targets of corporate espionage. The challenge becomes even more difficult when communications are made from locations that do not have structures that have been built to prevent eavesdropping and the like, such as when a member of the presidential cabinet, foreign service or military travels to a foreign country, works in an embassy built by some other country or travels to a locale within the United States that is not considered secure from a communications point of view.

Secure enclosures that protect against electromagnetic interference (EMI), radio frequency interference (RF), and acoustic and electronic eavesdropping, such as TEMPEST type enclosures, have been in operation for more than fifty years. Existing, secure enclosures are very heavy. For example, just a door of the enclosure may weigh 600 lbs. Thus, transporting such enclosures, installing and assembling them can be complicated and costly. For example, a typical enclosure may require several skilled workers that are trained in the proper installation of such an enclosure.

Typically, the design of existing enclosures, as well as the materials used in such enclosures, leads to installation errors and mistakes. For example, components of such enclosures may become damaged (e.g., bent) during shipment. Thus, it may be difficult to properly assemble such an enclosure and, even if assembled, the electronic security features of such an assembly may be compromised (e.g., electronic signals may leak out, or eavesdropping signals may penetrate). Often skilled workers must be available to repair damaged components. This increases the overall cost of the enclosure's installation. Worse yet, if skilled workers are not available, non-skilled workers may attempt to install or repair an enclosure. Unfortunately, this may lead to improper assembly or repair, and relatedly, compromise the electronic security features of an enclosure (e.g., leakage of electronic signals).

Still further, the design of some existing enclosures makes them inherently susceptible to electronic signal leakages. For example, many existing enclosures require mechanical connections. It is very difficult to prevent signals from leaking out (or into) from such connections. The main door of an existing enclosure may weigh 600 pounds or more thus requiring precise installation. Over time, such a door may not close properly due to the weight being constantly placed on its supporting structure (hinges). Even small openings in an enclosure that are not properly sealed by such a door may lead to total compromise of the enclosures' electronic security features. Existing doors also use components to attempt to insure proper sealing of the enclosures' main opening, such as beryllium "finger knives", and spring conductors for example. These additional components may become out of alignment, again resulting in compromising the security features of the enclosure.

Accordingly, it is desirable to provide secure enclosures that provide an increased level of EMI/RF, Electromagnetic pulse (EMP), acoustic and electronic eavesdropping protection (i.e., attenuation) as existing enclosures, but overcome the problems associated with the existing enclosures as well as provide protection against chemical, biological and radiological (CBR) materials.

SUMMARY

The present invention provides for modular shielded enclosures and related methods using lightweight, glidable shielded walls (e.g., doors). In one embodiment a closure system for an accredited enclosure may comprise a lightweight, glidable shielded component, and a drive system for moving the component in a first direction to a position that covers an opening in an accredited enclosure. The system may further comprise a rail located at or above a top edge of the component, and a roller assembly connected to a top edge of the component and the rail to allow the component to glide or move in the first direction. In an embodiment, the drive system may comprise a coupling system, such as a modified Halbach array for example.

In another embodiment the component may comprise one or more integral layers of a lightweight shielding material and a dielectric material, and/or one or more integral layers of a ballistic material. Further, the component may be configured to attenuate one or more electromagnetic frequencies over the range of 20 MHz to 18 GHz, as well as provide 40 dB of passive sound attenuation.

The closure system may further comprise a second-axis, closure control system that may be operable to move a so-positioned component in a second direction to form a seal of the opening of the accredited enclosure. In an embodiment, one part of the second-axis, closure control system may be an inflatable bladder, among other elements.

In addition to closure systems, the present invention provides for related methods. One such method may comprise a method for closing an accredited enclosure, where the method comprises using a drive system to move a lightweight, glidable shielded component in a first direction to a position that covers an opening in an accredited enclosure. Once correctly positioned, the method may further comprise moving the positioned component in a second direction to form a seal of the opening of the accredited enclosure.

Similar to before, the drive system may comprise a coupling system, such as a modified Halbach array, and the component may comprise one or more integral layers of a lightweight shielding material and a dielectric material, and/or one or more integral layers of a ballistic material. As before, the component may be configured to attenuate one or more electromagnetic frequencies over the range of 20 MHz to 18 GHz, and provide 40 dB of passive sound attenuation.

It should be understood that with respect to both the closure systems and related methods the component may be positioned within an accredited enclosure, or outside an accredited enclosure.

BRIEF DESCRIPTION OF THE DRAWINGS

FIG. 1C depicts a motorized assembly drive used to move a glidable shielded door component according to an embodiment of the invention.

FIGS. 1D through 1I depict close up views of one of two roller assemblies used in conjunction with the motor assembly to move a lightweight, glidable shielded door component according to an embodiment of the invention.

FIG. 1K depicts the names of exemplary reference names given to layers of a component (e.g., door) that are referred to in FIGS. 1L through 1O.

FIGS. 1L through 1O depict various layers that may be used to construct a lightweight, glidable, shielded door component according to embodiments of the invention.

FIG. 2 depicts a simplified illustration of an exemplary secure accredited enclosure that includes a lightweight, glidable shielded door component according to an embodiment of the invention.

FIGS. 3A and 3B depict different views showing exemplary positioning of a lightweight, glidable shielded door component according to an embodiment of the invention.

FIG. 3C depicts exemplary interior and exterior dimensions for openings in an accredited enclosure that must be closed and sealed by a lightweight, glidable shielded door component according to an embodiment of the invention, it being understood the dimensions set forth in FIG. 3C, other figures and elsewhere herein are merely exemplary, and may be changed to fit a specific application/use/environment. Said another way, the exact dimensions of the interior and exterior openings for a given enclosure may vary.

FIG. 3E depicts an exemplary bladder system according to an embodiment of the invention.

FIG. 3F depicts exemplary dimensions of a lightweight, glidable shielded door component according to an embodiment of the invention.

FIG. 4A depicts a simplified diagram of the positioning of one or more sealing gaskets according to an embodiment of the invention.

FIG. 4B depicts gaskets configured concentrically with respect to one another according to an embodiment of the invention.

FIGS. 4C and 4D illustrate some exemplary shapes of gaskets according to embodiments of the invention.

FIGS. 5A through 5C depict simplified drawings of the positioning and operation of an interlocking switch according to an embodiment of the invention.

FIGS. 6A and 6B depicts electromagnet components according to an embodiment of the invention.

FIGS. 7A to 7C provide simplified illustrations of the movement of a lightweight, glidable shielded door component according to embodiments of the invention.

FIGS. 9A to 9D depict exemplary closure systems according to embodiments of the invention.

Figure 1A:
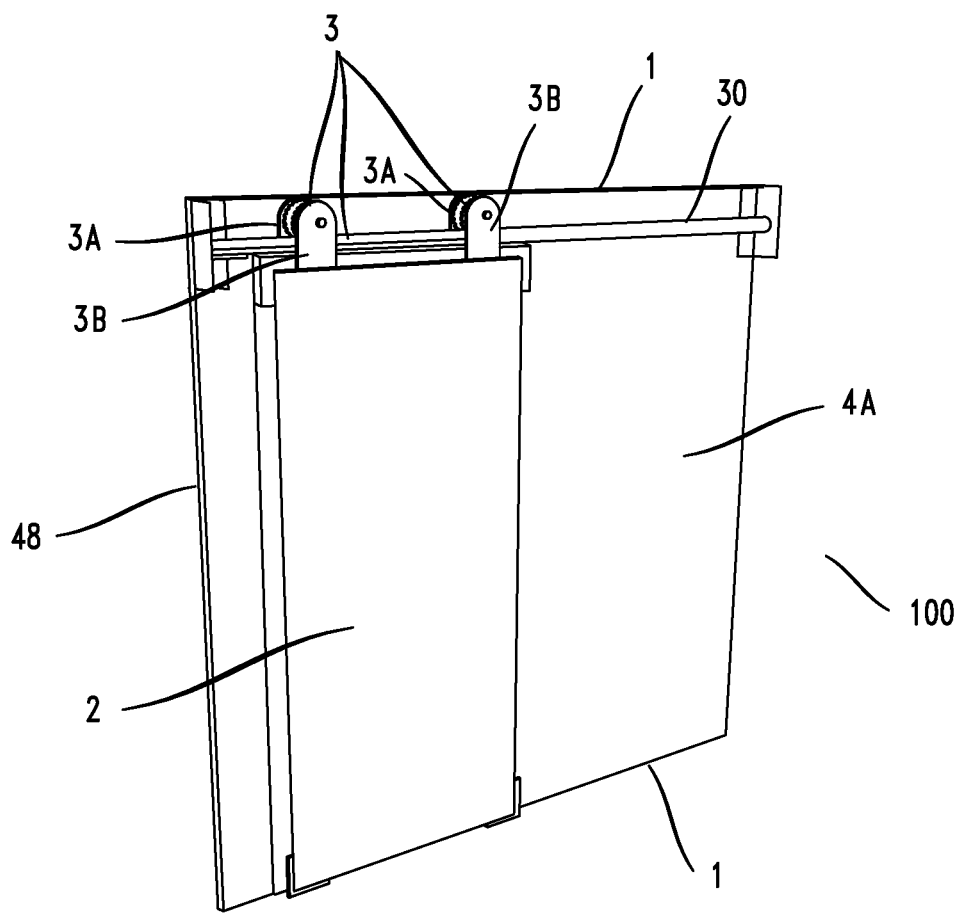
FIG. 1A depicts an interior side of an accredited. lightweight shielded enclosure that includes a closure system in accordance with an embodiment of the invention.

To the extent that any of the figures or text included herein depicts or describes dimensional or geometrical information it should be understood that such information is merely exemplary to aid the reader in understanding the embodiments described herein. It should be understood, therefore, that other dimensions and/or geometries may be used to construct the inventive devices, systems and components described herein and their equivalents without departing from the scope of the inventions.

DETAILED DESCRIPTION OF THE INVENTION, WITH EXAMPLES

Exemplary embodiments of modular, lightweight shielded and accredited enclosures using lightweight, glidable shielded components (e.g., doors, walls) and related methods are described herein. Although specific exemplary embodiments are discussed herein, there is no intent to limit the scope of the present invention to such embodiments. To the contrary, the exemplary embodiments discussed herein are for illustrative purposes. Modified and alternative embodiments may be implemented without departing from the scope of the present invention. Said another way, the exemplary embodiments presented herein are only some of the many that fall within the scope of the present invention, it being practically impossible for the inventors to describe all the many possible exemplary embodiments and variations that fall within the scope of the present invention.

It should also be understood that one or more exemplary embodiments may be described as a process or method. Although a process/method may be described as sequential, such a process/method may be performed in parallel, concurrently or simultaneously. In addition, the order of each step within a process/method may be re-arranged. A process/method may be terminated when completed and may also include additional steps not included in a description of the process/method.

As used herein, the term "and/or" includes all combinations of one or more of the associated listed items. As used herein, the singular forms "a," "an" and "the" are intended to include the plural form, unless the context and/or common sense indicates otherwise. It should be further understood that the terms "comprises", "comprising,", "includes" and/or "including", when used herein, specify the presence of stated features, systems, subsystems, steps, operations, elements, and/or components, but do not preclude the presence or addition of one or more other features, systems, subsystems, steps, operations, elements, components, and/or combinations thereof.

As used herein, the designations "first", "second", etc., is purely to distinguish one component (e.g., element, component, side, etc.) or part of a process from another and does not indicate an importance, priority or status. In fact, the component or parts of a process could be re-designated (i.e., re-numbered) and it would not affect the operation of the enclosures or methods provided by the present invention.

Yet further, when one part of an enclosure or system is described or depicted as being connected to another part using "a connection" (or single line in a figure) it should be understood that practically speaking such a connection (line) may comprise (and many times will comprise) more than one physical connection.

It should be noted that the enclosures and methods illustrated in the figures are not drawn to scale, are not representative of an actual shape or size and are not representative of any actual enclosure, system, layout, manufacture's drawing or visual. Rather, the enclosures and systems, etc., are drawn to simply help explain the features, functions and processes of exemplary embodiments of the present invention described herein and covered by the claims set forth at the end of this description.

The phrase "accredited area" or "accredited enclosure" means at least a Sensitive Compartmented Information Facility (SCIF), or a Telecommunications Electronics Material Protected from Emanating Spurious Transmissions (TEMPEST) SCIF, or a Temporary Secure Working Area (TWSA) or an equivalent or higher secured facility or area.

The phrases "interior", "inner" or "internal" mean inside or within an accredited area or an accredited enclosure or a surface that can be touched by an individual inside an accredited area or enclosure while the phrase "exterior", "outer" or "external" mean the opposite, i.e., outside an accredited area or accredited enclosure or a surface that cannot be touched by an individual while inside an accredited area or accredited enclosure.

As used herein, the term "embodiment" or "exemplary" refers to one example of the present invention.

As used herein the phrase "operable to" means "functions to".

As used herein the phrases "microcontroller", "programmable logic controller (PLC)" "control system" and "controller" mean at least one or more electronic processors and associated memories operable to execute stored, specialized instructions for completing features and functions described herein. Such instructions may be stored in an onboard memory, in separate memory, or in a specialized database for example. Such instructions represent functions and features that have been integrated into memory as stored electronic signals.

The present invention provides for lightweight, shielded accredited enclosures and lightweight, glidable shielded components, such as doors, that meet or exceed specifications set forth in military specification MIL-STD-188-125-2 (RF shielding), STC-30 (sound transmission) and the Technical Specification for Construction and Management of Sensitive Compartmented Information Facilities, Version 1.4, IC Tech Spec-for ICD/ICS 705 dated Sep. 28, 2017.

Referring now to FIG. 1A, there is shown an interior side 1 of a lightweight shielded accredited enclosure 100 that includes a closure system that functions to provide EMI/RF, EMP, acoustic, electronic eavesdropping and/or CBR protection in accordance with an embodiment of the invention. In more detail, in addition to being shielded, the enclosures provided by the present invention may comprise pressurized enclosures, for example, to provide protection from CBR material or contaminants (collectively "material"). Yet further, enclosures provided by the present invention may provide so-called "collective protection" against CBR attacks (see https://en.wikipedia.org/wiki/Collective_protection). In CBR embodiments enclosures provided by the present invention may operate under slight positive pressure to prevent dangerous CBR agents from penetrating (e.g., a pressure such as a ½ inch of water pressure will effectively maintain a pressure to cause flow towards the outside of an enclosure). Further, the slight pressure on a glidable, shielded component (door) helps to further seal gaskets. Accordingly, the present invention provides for air pressure monitors inside such an enclosure. Such monitoring may also provide an indication of whether seals created by gaskets used with the enclosure are good or might need to be replaced.

Figure 1B:
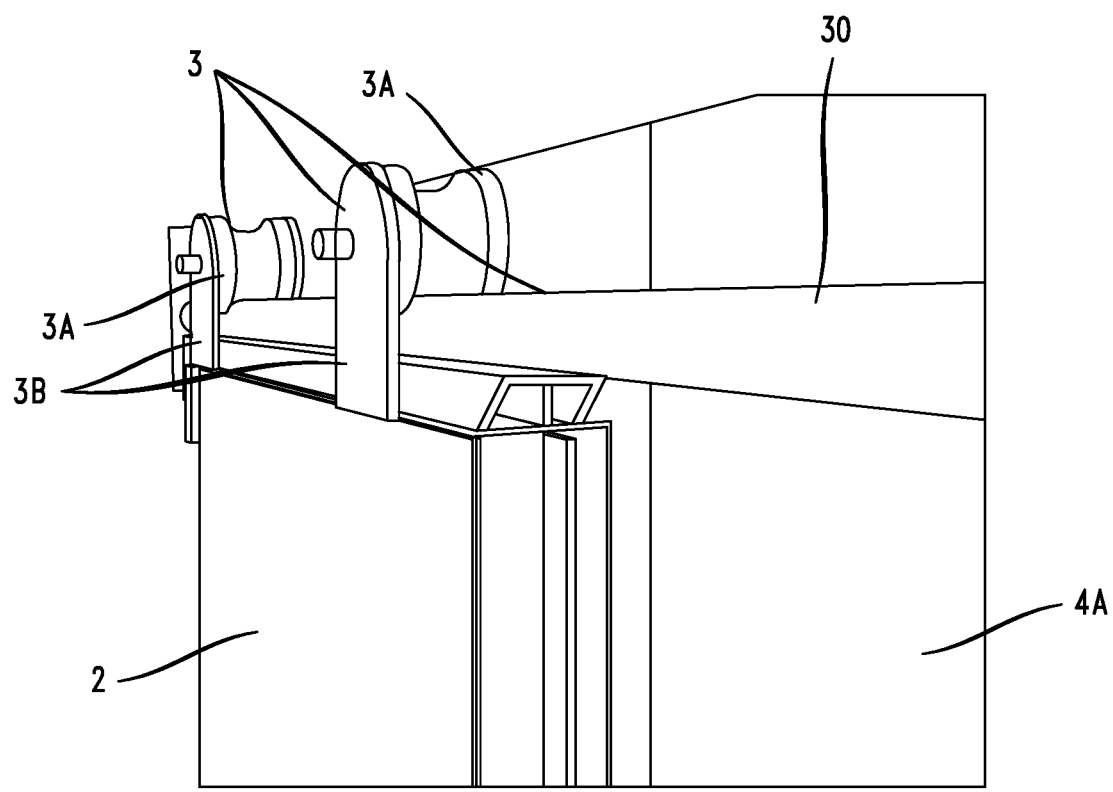
FIG. 1B depicts another, close-up view of a component of an accredited, lightweight shielded enclosure in accordance with an embodiment of the invention component.
Figure 1E:
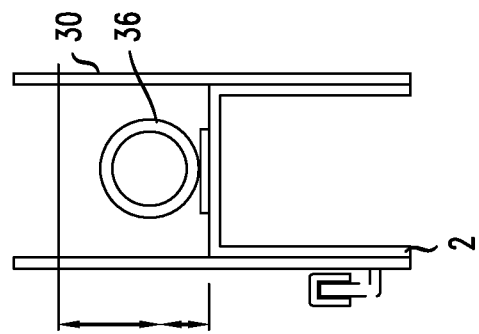
Figure 1D:
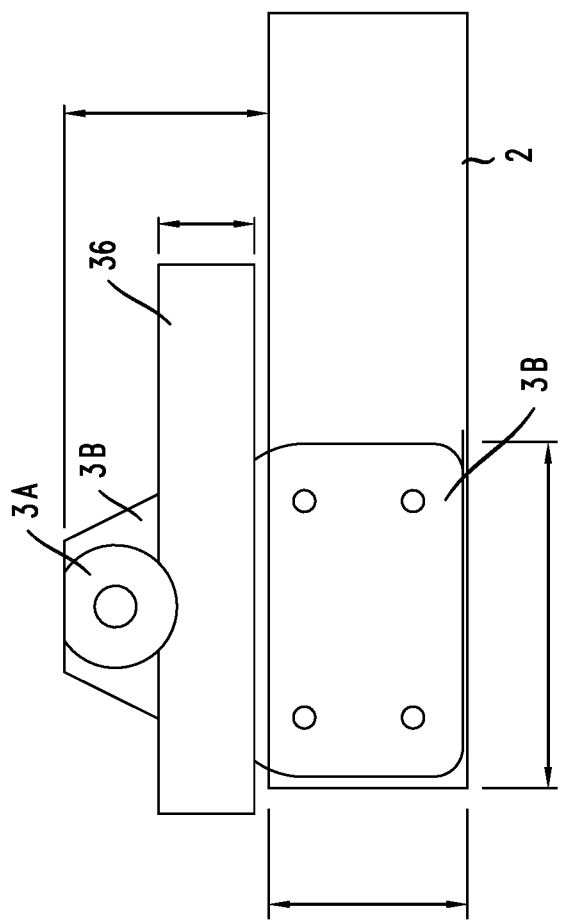

As shown the closure system comprises an interior lightweight, glidable, shielded closure component 2 and a closure control system 3 the details of which are set forth herein. In one embodiment, the lightweight, glidable shielded closure component 2 may comprise a multi-layered component and may weigh approximately 50 to 55 lbs., for example (excluding the weight of elements of component 3 and framing). FIG. 1B depicts another, close-up view of component 2 and system 3. In one embodiment, the interior lightweight, glidable shielded closure component 2 may be positioned adjacent an interior surface 4A of a wall of an accredited enclosure, where the wall may comprise one or more slidable shielded, staggered and overlapping (collectively "overlapping") panels that are described in more detail in the '317 Application. In embodiments, the lightweight shielded accredited enclosure 100 (walls or panels of the enclosure) and component 2 may be configured using appropriate layers of material described elsewhere herein to function to attenuate one or more electromagnetic frequencies over the range of 20 MHz to 18 GHz, for example. In addition, the lightweight shielded enclosure 100 and component 2 (and all accredited enclosures and glidable shielded components provided by the present invention) may be configured to function to meet or exceed the audio or sound attenuation specifications set forth in specification STC-30 for sound transmission, e.g., 40 dB of passive attenuation.

In addition to meeting the electromagnetic and audio/sound attenuation specifications described herein, each of the accredited lightweight, shielded enclosures and glidable shielded components 2 provided by the present invention meet or exceed the specifications set forth in the Technical Specification for Construction and Management of Sensitive Compartmented Information Facilities, Version 1.4, IC Tech Spec-for ICD/ICS 705 dated Sep. 28, 2017.

In embodiments of the invention, the lightweight, shielded closure component 2 (hereafter "component 2" for short) and closure system 3 operate in conjunction with one another to function to form a seal for a passageway or opening (collectively "opening") in the wall that allows ingress and egress to, and from, the inside chamber of the accredited enclosure as well as provide an increased level of EMI/RF, EMP, acoustic, electronic eavesdropping and CBR protection versus existing systems. By "shielded" is meant capable of preventing EMI, RF, EMP, or acoustic signals from penetrating (i.e., attenuating such signals).

In an embodiment, the incorporation of component 2 provides certain advantages over existing closure mechanisms and methods. For example, because the component 2 may be positioned within an enclosure, such as adjacent the interior surface 4A, and not exterior surface 4B, of a wall of an enclosure, control of the operation of the component may also be made from within the enclosure. Further, in accordance with embodiments of the invention, a slight positive pressure applied to the component 2 towards the interior surface 4A by exemplary inventive means described herein or by those known in the art or manually, for example, is all that is required to seal the opening using the component. This is especially important if, and when, any unexpected spillage or exposures of chemical, biological or radioactive material occur within the enclosure to ensure such materials do not escape the enclosure (or vice-versa). As explained further herein, because the component 2 is glidable it does not require additional space to open and close as is the case with many existing doors (e.g., swing doors). Thus, secure accredited enclosures making use of the component 2 typically will have a smaller overall "foot print" (i.e., require less space). This can be important when an electronically secure enclosure is required to be assembled and installed within another existing room that is not electronically secure and whose dimensions cannot be easily or readily changed (i.e., increased), for example. Yet further, due to its light weight (e.g., 55 lbs. or less) component 2 may be easily installed, and replaced when compared to much heavier doors. As will be discussed in more detail herein, the use of a glidable lightweight component, such as component 2, also allows for the simplification of the repair or maintenance of the component 2 and associated elements used in conjunction with component 2 to properly seal an opening in an enclosure. For example, seals used with component 2 may be easily replaced as compared with existing systems.

Figure 1J:
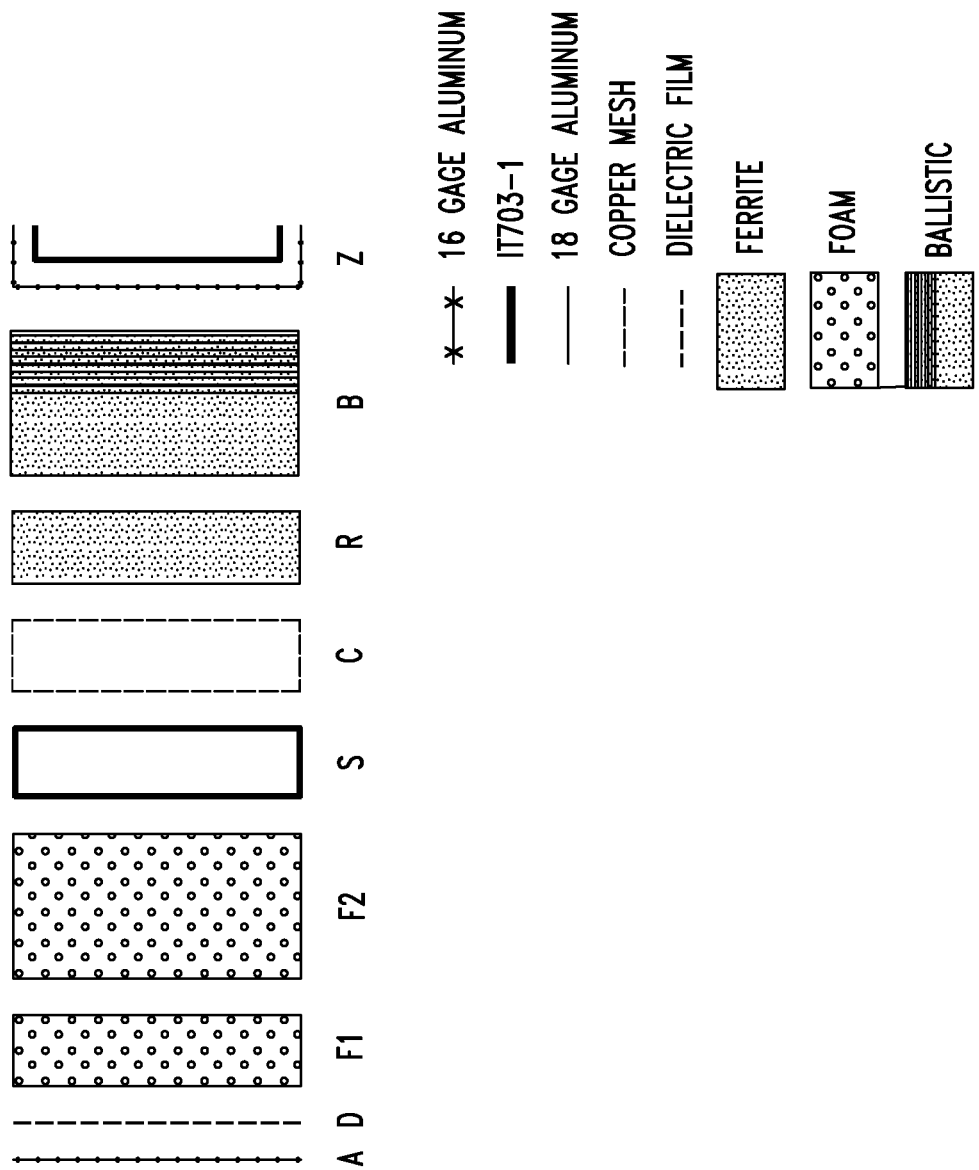
FIG. 1J depicts a key or reference chart that includes symbols representing some of the different materials that may be used in one or more layers of a lightweight, glidable shielded door component according to embodiments of the present invention.
Figure 1L:
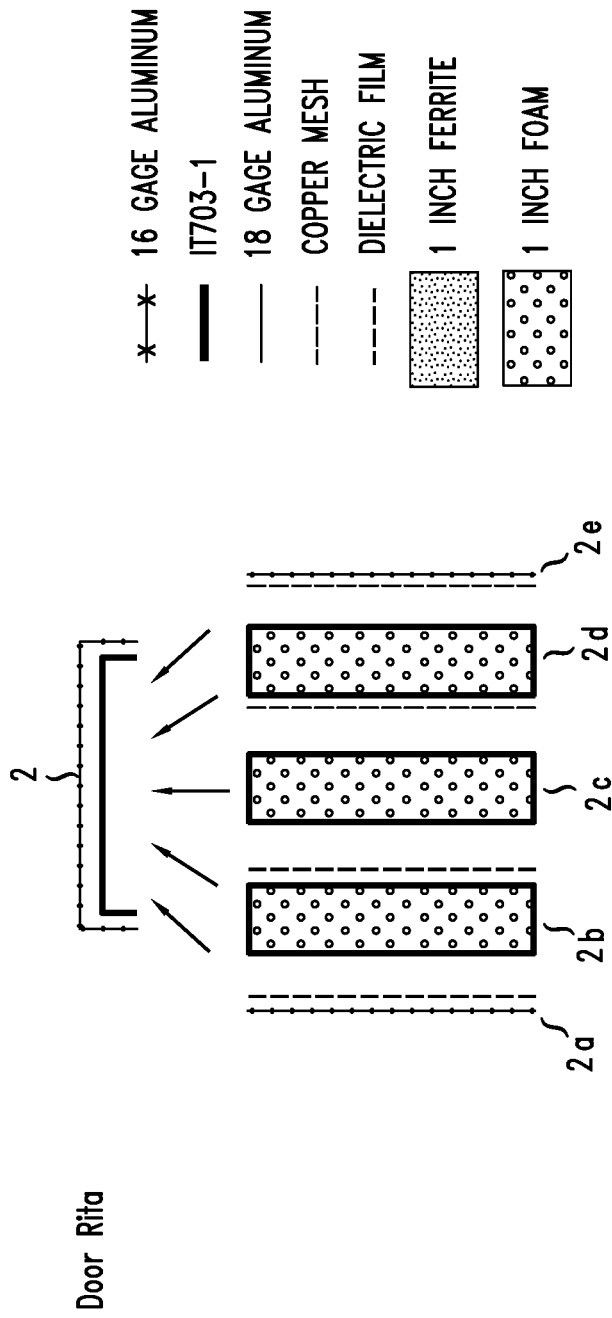
Figure 1M:
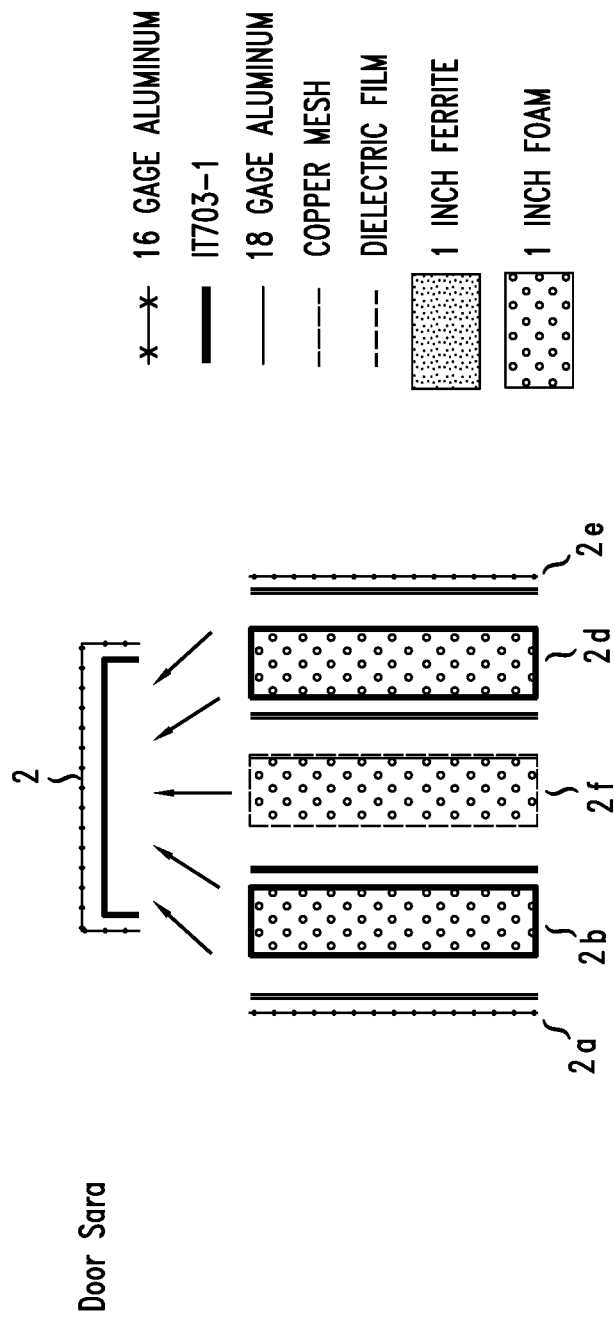
Figure 1N:
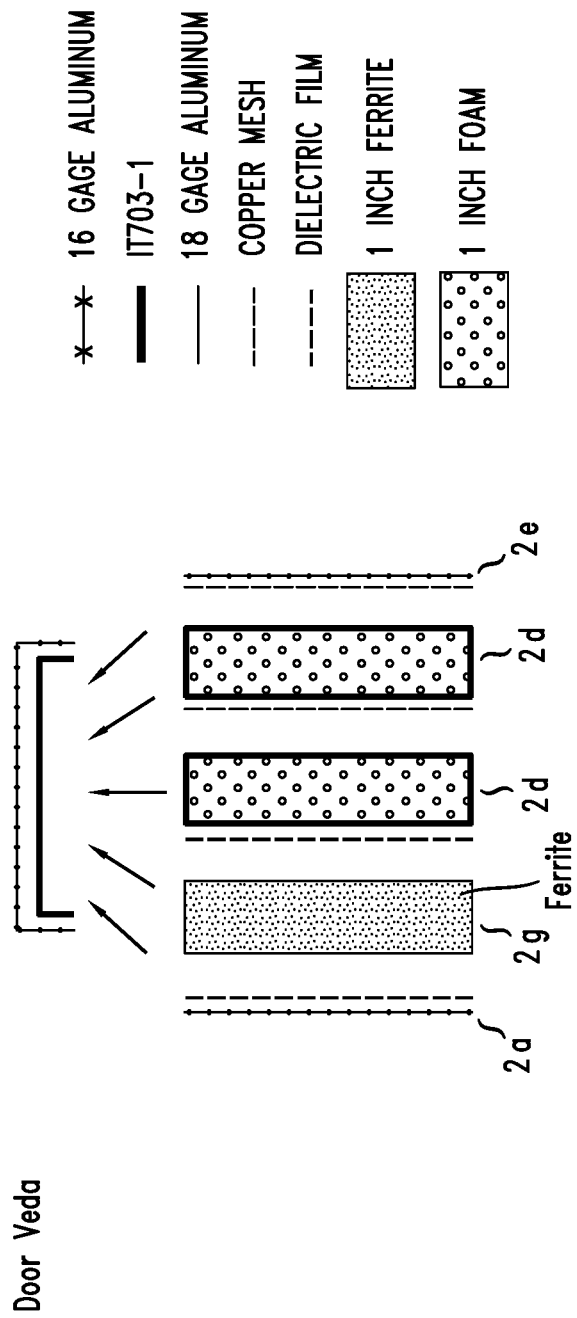
Figure 10:
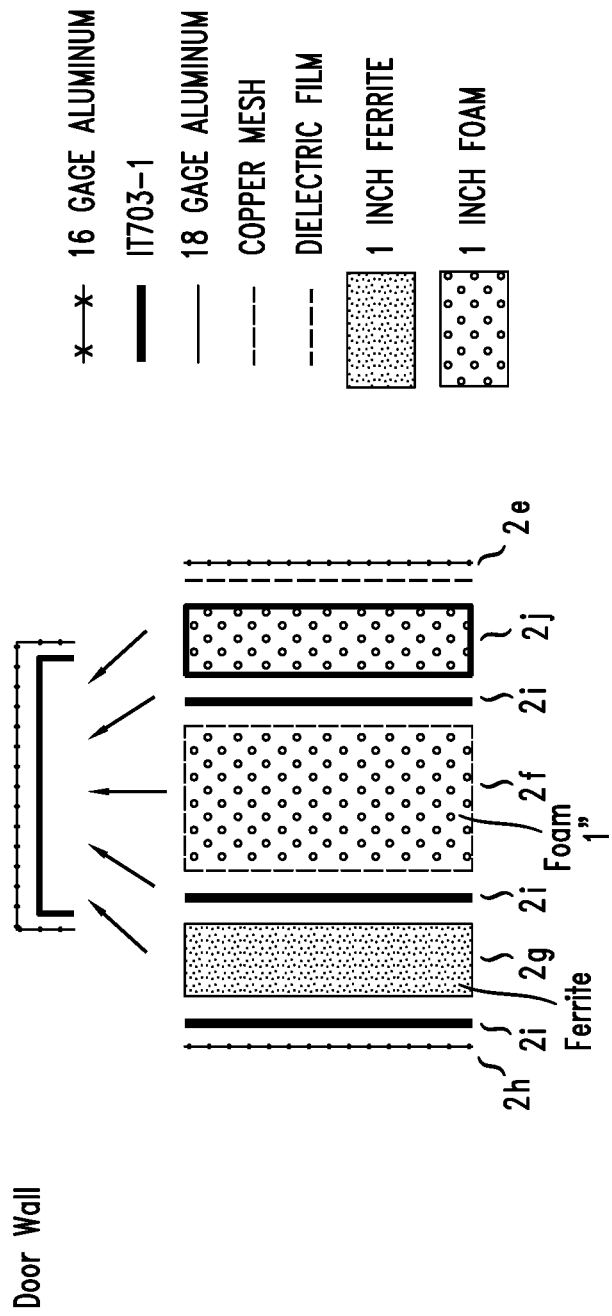

The glidable shielded closure component 2 may comprise a number of different integral layers of lightweight shielding material (material that has appropriate plastic and elasticity moduli), dielectric material and ballistic material among other layers. FIG. 1J depicts a key or reference chart that includes symbols representing some of the different materials that may be used in one or more integral layers of a component 2 according to embodiments of the present invention. These materials include, but are not limited to, aluminum, copper and ferrite as shielding materials, a dielectric foam or a film that comprises an adhesive or non-adhesive thin plastic membrane, or any other dielectric material such as the one used in electrical tape. In an embodiment, the dielectric film may be deposited between layers by brushing or spraying a dielectric liquid, for example. Still further, a core material may be a dielectric foam but depending on the application the material may be conductive honey comb material such as aluminum or other metals or even non-conductive honeycomb materials such as epoxy impregnated paper or fabric. Additional material making up an integral layer may comprise a nylon with silver deposit or more exotic materials including the ones presently developed with nanotechnology and other advanced fiber composites, and ballistic materials such as a lightweight Kevlar or Dyneema or even a ceramic tile. It should be understood that integral layers of ballistic material may be configured as a part of a panel, wall section or component 2. For ease of reference these integral layers are given random names such as "Alpha", "Charlie", "Lima" and "Sierra" as seen in FIG. 1K. Various embodiments of a glidable shielded closure component 2 are depicted in FIGS. 1L through 1O. As shown a component 2 may comprise one or more different integral layers 2a through 2j which may be combined to form such a component 2. It should be noted here that the thickness of a foam core can vary depending of application. In one embodiment, the thickness may be one inch for a wall section and two inches for a floor section, though the dimensions may vary depending on the structural strength requirements (e.g., a large enclosure may have both a thick core (beam effect) as well as high density foam which offers high shearing strength).

Referring back to FIGS. 1A and 1B, the closure control system 3 may comprise a first axis closure control system that may comprise a roller assembly that comprises rollers 3A and fasteners 3B for connecting the rollers 3A to the component 2. Thus, in this embodiment the component 2 is connected to rollers 3A and fasteners 3B only on the top edge of the component 2. Further, the so connected rollers 3A, 3B and component 2 may then be positioned (e.g., hung) within a rail 30. As a force is applied by a drive system (explained elsewhere herein) the component 2 is operable to glide along the rail 30 located at or above the top edge of component 2 along a first axis (e.g., x-axis) in a first direction via its connection to rollers 3A without making contact with the interior surface 4A of a wall of the enclosure or using a bottom rail to cover an opening 5A (see FIG. 1C) in the enclosure. FIG. 1C depicts the component 2 (e.g., door) in an open and closed position with respect to an opening 5A in the enclosure 100. FIG. 1C further depicts additional components of the first axis, closure control system, such as a motorized assembly drive system 31 ("drive system") that may comprise a stepped motor 31a magnetic coupling assembly 31c, sprockets 31e and a high tensile (e.g., breaking strength of 19,600 lbs.) horizontal translation/belt 35. The drive system 31 may comprise other elements, such as reduction gears, a clutch, slip rings, and additional connection means that for the sake of clarity have been omitted from the figures herein. As a motor 31a operates it causes the sprockets 31e to rotate which imparts a force to the belt 35 causing the component 2 in turn to move. In one embodiment, the drive system may comprise an electromagnetic coupling system (see FIG. 1Q), such as a modified Halbach array drive system (modified in that it includes "north" and "south" vectors but not "left" and "right" vectors). One advantage of using an electromagnetic coupling system is that it allows for ease of installation of the motor 31a and sprockets 31e (i.e., their connection is easily adjusted). Further, the gap between magnets making up the coupling system may be adjusted, thus permitting the coupler to function as a torque limiter to further control the movement of the component 2.

FIGS. 1D through 1I depict a close up view of the roller assembly that may be positioned on one top side of the component 2, it being understood that a substantially similar assembly may be located on the opposite top side of the component 2 as well (i.e., there may be at least two roller assemblies). To simplify our explanation, we will focus on one of the assemblies, it being understood that the explanation can be applied to the assembly on the opposite top side.

As shown in FIGS. 1D through 1I, a roller assembly may include a roller 3A (only one is shown for simplicity of explanation), fastener 3B for connecting the roller 3A to component 2, and rail tube 36 within rail 30. Also shown are gaskets 32 and bladder 31A (discussed elsewhere herein).

Figure 1P:
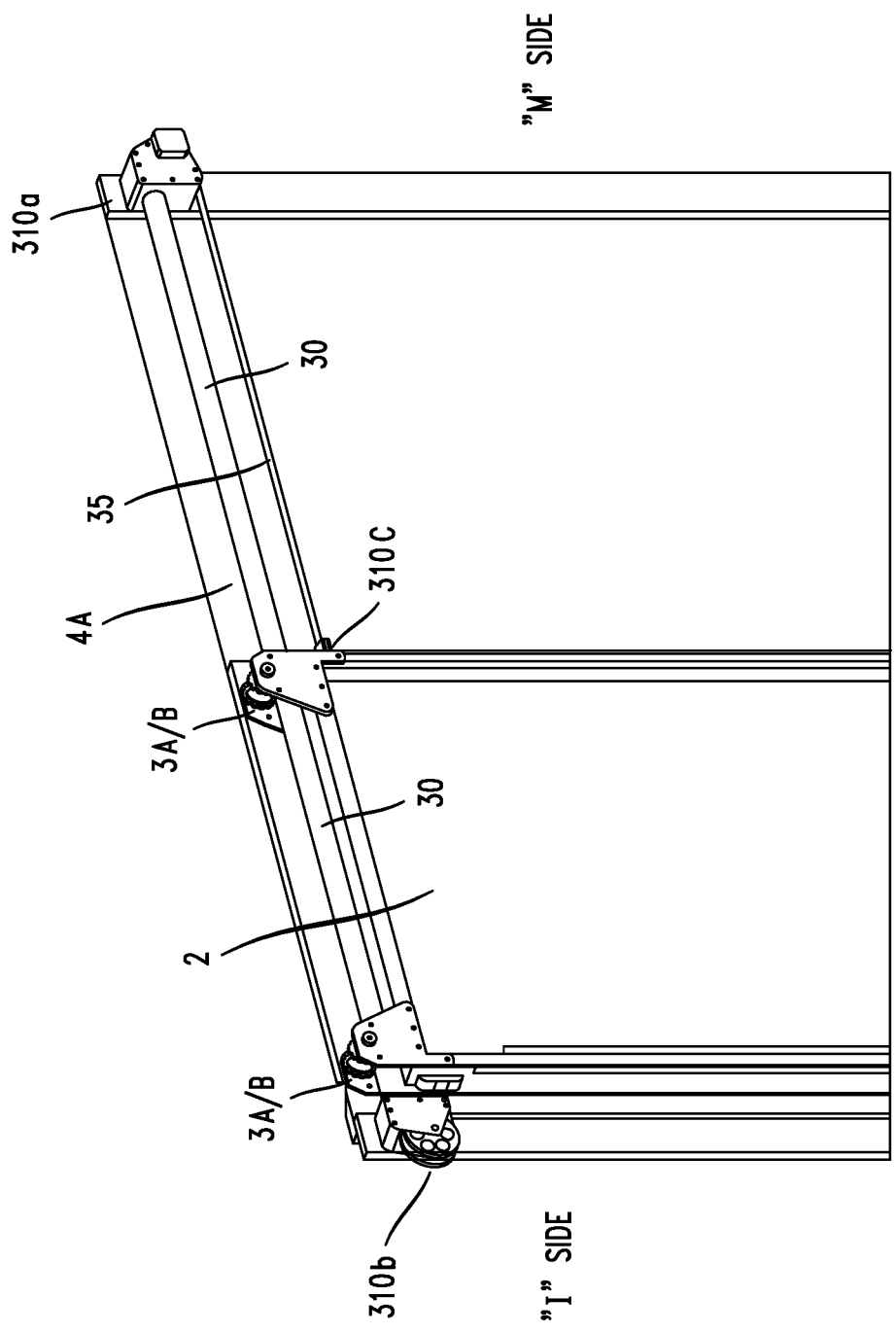
FIGS. 1P to 1S depict elements of embodiments of the invention.
Figure 1Q:
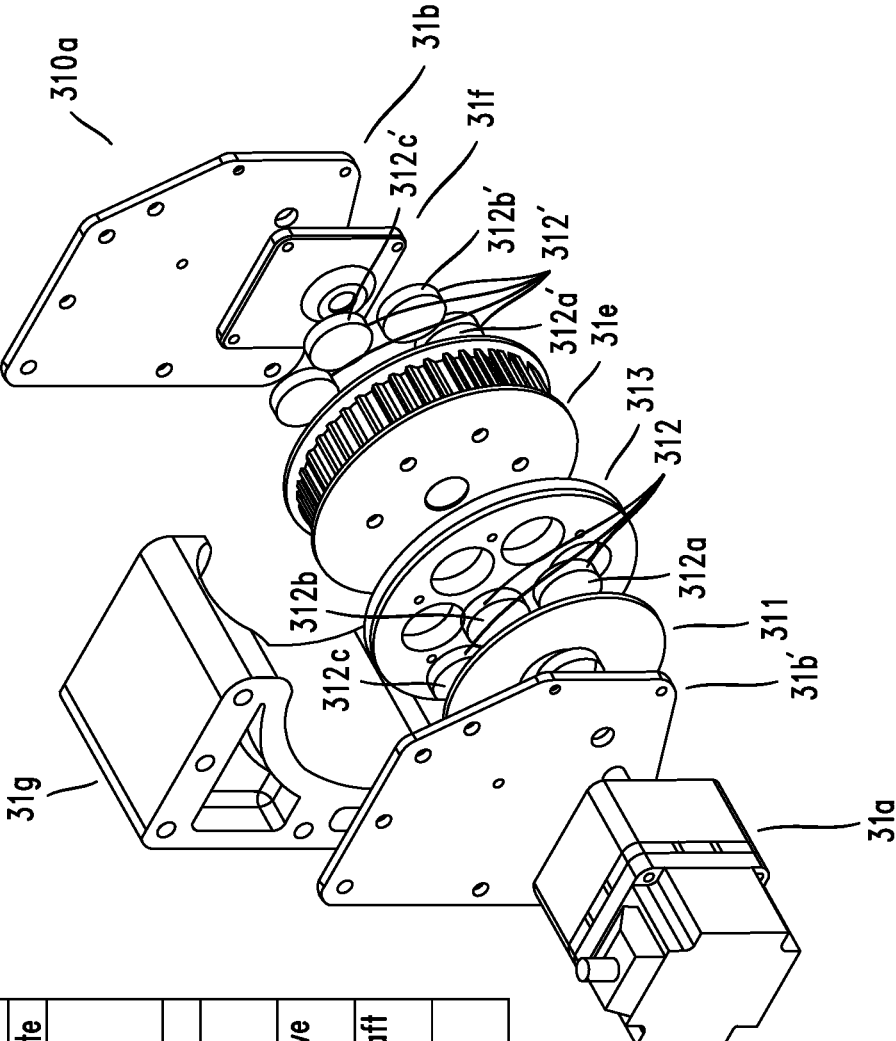

Referring now to FIG. 1P there is shown another depiction of the drive system. For ease of explanation we shall refer to a "motor" side "M" and an idler side "I" of the drive system. In an embodiment, the drive system 31 may comprise a motor side assembly 310a and an idler side assembly 310b, it being understood that the motor side assembly 310a comprises, among other things, motor 31a and a coupling system (e.g., electromagnetic coupling). As noted above, as the motor within the motor side assembly 310a operates it causes sprockets to rotate which imparts a force to the belt 35 causing the component 2 in turn to move. In more detail, FIG. 1Q depicts an exemplary motor side assembly 310a. As shown, the assembly 310a may comprise a motor 31a, motors plates 31b, 31b', a coupling system 31c comprised of an electromagnetic coupling washer 311 and magnetic coupling 313 operable to connect the motor 31a to the magnets 312 (but not to magnets 312') where the magnets 312, 312' comprise a plurality of modified Halbach array configured magnets. The assembly 310a may further comprise motor drive sprockets 31e, motor shaft bearings 31f and motor bracket 31g.

In an embodiment, the plurality of magnets 312, 312' may be configured so that the polarity of adjacent magnets on each side of the sprockets 31e are interleaved. For example, magnet 312a may have a positive polarity, magnet 312b a negative polarity and magnet 312c a positive polarity. This interleaving of the polarity is continued for all magnets on one side of the sprockets 31e. The same is true for magnets 312a', 312b' and 312c' on the opposite side of sprockets 31e. In addition, each opposing magnet has an opposing polarity. For example, if magnet 312a has a positive polarity, then opposing magnet 312a' has a negative polarity, and if magnet 312b has a negative polarity than opposing magnet 312b' has a positive polarity, and so on. In an embodiment, as energy (i.e., power) is applied to the motor 31a (by an alternating current power supply or an uninterruptible power supply) it functions to turn magnets 312 on one side of the sprockets 31e. In an embodiment, this action creates electromagnetic fields between the oppositely polarized modified Halbach magnets 312 and 312' whose vectors apply forces that are exerted on sprockets 31e in between the oppositely polarized magnets 312, 312' in order to turn sprockets 31e in a particular rotational direction (clockwise or counterclockwise) to move the belt 35 (not shown in FIG. 1R) in one, first direction or the other in order to cause component 2 to cover (or uncover) an opening in an enclosure.

Figure 1R:
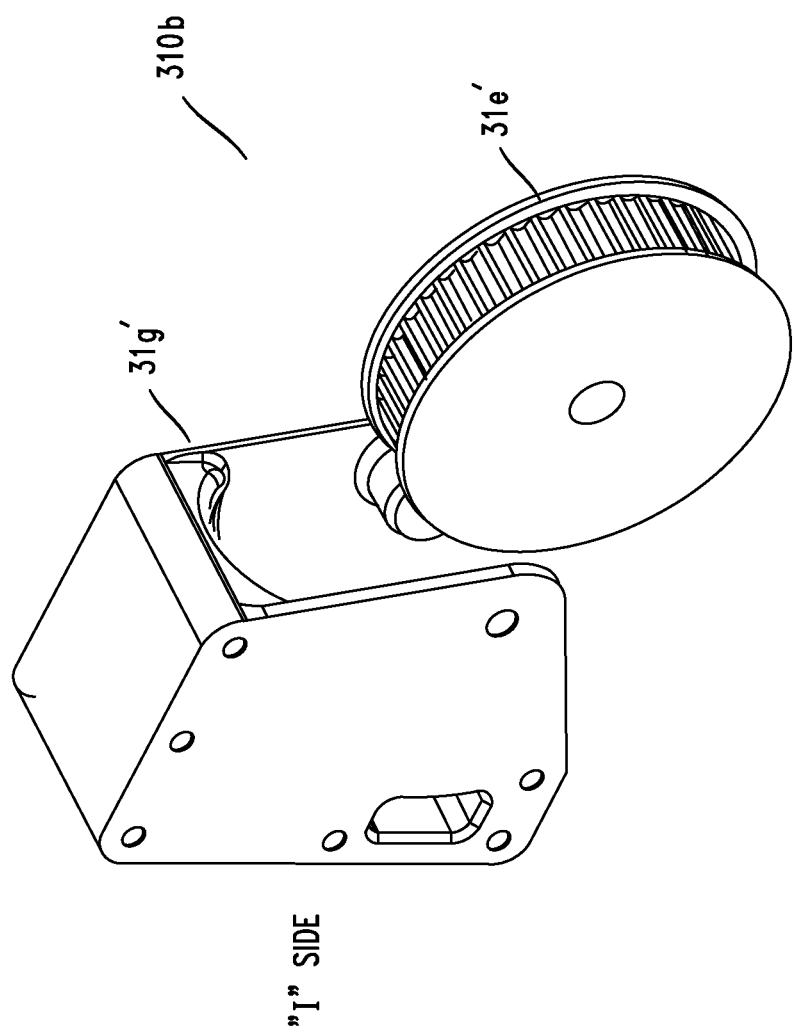
Figure 1S:
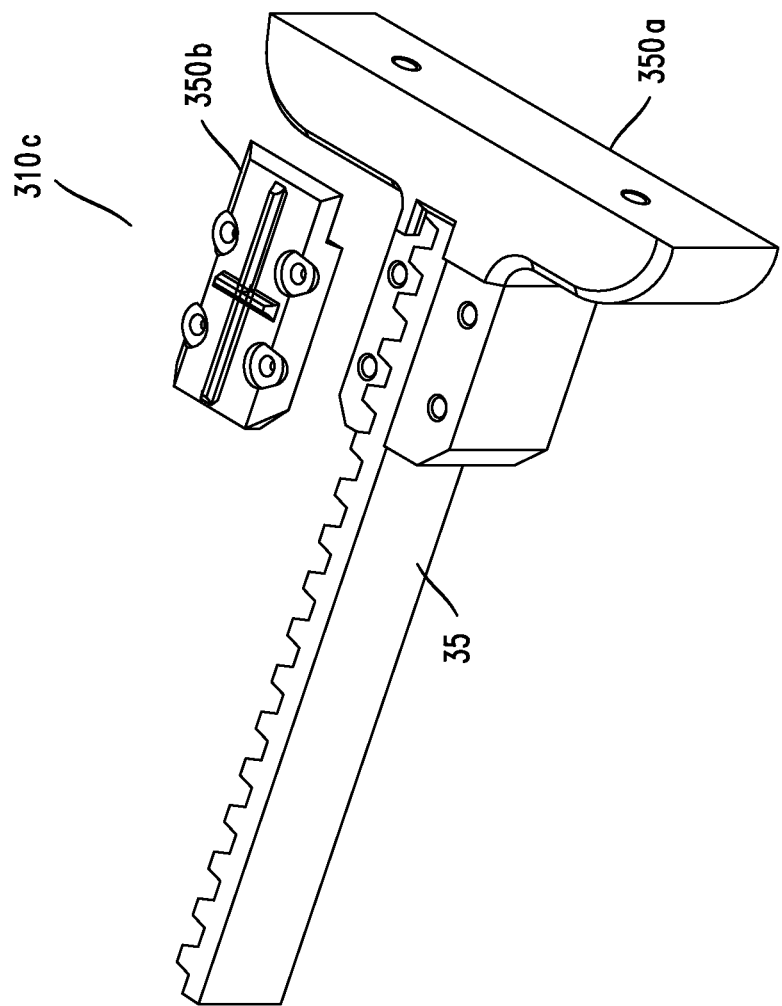

FIG. 1R depicts an exemplary idler assembly 310b. As depicted the assembly may comprise an idler bracket 31g' for securing am idler sprocket 31e'. In an embodiment, as the motor side assembly 310a applies forces to turn the sprockets 31e and move the belt 35 as well as move the belt 35 over the sprockets 31e' on the idler side as well. Referring now to FIG. 1S there is depicted a belt securing system 310c that may be located as shown in FIG. 1P. An exemplary system 310c may comprise a belt clamp 350a for securing the belt 35 to the component 2 and a cover 350b for covering, adjusting and protecting the belt 35 and belt clamp 350a connection.

FIG. 2 shows a greatly simplified illustration of a secure accredited enclosure 1 that includes a component 2 positioned within the enclosure 1. As shown, the secure enclosure 1 itself may be positioned within another enclosure 10, such as a room, another secure accredited enclosure, non-secure enclosure, etc. In more detail, in the embodiment depicted in FIG. 2 the enclosure 1 comprises an exemplary component 2 and shielded walls 4, such as those described in the '317 Application for example, positioned within the volume of space of enclosure 10. Though in this embodiment the enclosure 10 is depicted as including a swinging door 20 it should be understood that the door 20 may comprise an exemplary, lightweight glidable shielded door having the same or substantially the same features and functions as component 2 and may incorporate a closure system such as exemplary system 3. Said another way, both enclosures 10 and 1 may comprise the same or substantially the same lightweight, glidable shielded door and closure system (from a shielded features point of view, i.e., the dimensions may be different), or one of components 2 or 20 may comprise a lightweight, glidable shielded door (and corresponding closure system 3). Though the second enclosure 10 is depicted as completely surrounding the first enclosure 1, this is merely exemplary. In other embodiments, the second enclosure 10 may form a vestibule or an ingress/egress compartment 21 that allows access to the first (inner) enclosure 1. Such a vestibule may not completely surround the first enclosure 1, Instead, it may comprise a dimensional footprint or volume that is adjacent to the component 2 (e.g., in front of component 2).

Another embodiment of an alternative secure accredited enclosure includes two components 2, where component one may be positioned within the enclosure while another is positioned external to the enclosure (e.g., attached to the external surface of a wall). In more detail, in this embodiment both components comprise a lightweight, glidable shielded component (and corresponding closure system 3).

Yet another simplified embodiment of an alternative secure accredited enclosure includes two components 2, where both components (and corresponding closure systems 3) may be positioned within the enclosure. Alternatively, both components (and one or more corresponding closure systems 3) may be positioned outside of the enclosure. Yet further, a single component 2 20A or 20B (and/or one or more corresponding closure systems 3) may be positioned outside of an enclosure.

The incorporation of more than one lightweight, glidable shielded component and closure system in an enclosure (or enclosures) may increase the level of EMI/RF, EMP, acoustic, electronic eavesdropping and CBR protection for those individuals and equipment within a given enclosure because any such signals or material would have to penetrate through at least two such components (or conversely be attenuated or prevented from penetrating by at least two such components). It should be noted that each of the lightweight, glidable shielded components may be configured to function to provide the same, or different levels of protection, for example (e.g., attenuate different levels) and/or provide the same, or a different type of protection. For example, component 2 may provide CBR protection while component 20 may provide EMI/RF, EMP, acoustic, and electronic eavesdropping protection, or vice-versa. Said another way, each of the components 2, 20 may be configured to function to provide one or more of the same or different types of protection (or combination of protections). Yet further, in addition to EMI/RF, EMP, acoustic, electronic eavesdropping and CBR protection one or more of the components 2,20 may be configured to include one or more integral layers of ballistic or armored material (collectively "ballistic material") that function to protect individuals and equipment within an enclosure from explosives, gunfire and other high velocity and/or high-powered projectiles or material. In one embodiment the component 20 may comprise one or more layers of material, for example. It should be further understood that one or more layers of ballistic material may be combined with other layers configured to protect against EMI/RF, EMP, acoustic, electronic eavesdropping and CBR to form a single exemplary lightweight, glidable shielded component (e.g., component 2, 20) or wall 4.

FIGS. 3A and 3B depict different views showing exemplary positioning of the component 2. FIG. 3A is a view from the interior of an enclosure, while FIG. 3B is from the exterior of the enclosure. In the drawing on the left side of FIG. 3A the component 2 is shown covering an interior opening 5A ("closed position") while in the drawing on the right side the component 2 is shown in an open position that uncovers the interior opening 5A. In FIG. 3B, the component 2 is shown covering an exterior opening 5B while in the drawing on the right side the component 2 is shown in an open position that uncovers the exterior opening 5B. It should be noted that openings 5A and 5B may be the same opening. In FIGS. 1A to 3B the interior and exterior openings are substantially the same dimensions, but this is merely exemplary. Different sized interior and exterior openings may be used. In the embodiments depicted in FIGS. 3A and 3B the component 2 is moved from one position to another (from an open position to a closed position, and vice-versa) by operation of the closure control system 3.

FIG. 3C depicts exemplary interior and exterior dimensions for the openings 5A and 5B, it being understood the dimensions set forth in FIG. 3C, other figures and elsewhere herein are merely exemplary, and may be changed to fit a specific application/use/environment. Said another way, the exact dimensions of the interior and exterior openings for a given enclosure may vary. Relatedly, FIG. 3F depicts exemplary dimensions of a component 2 (e.g., a door) according to an embodiment of the invention.

Figure 3D:
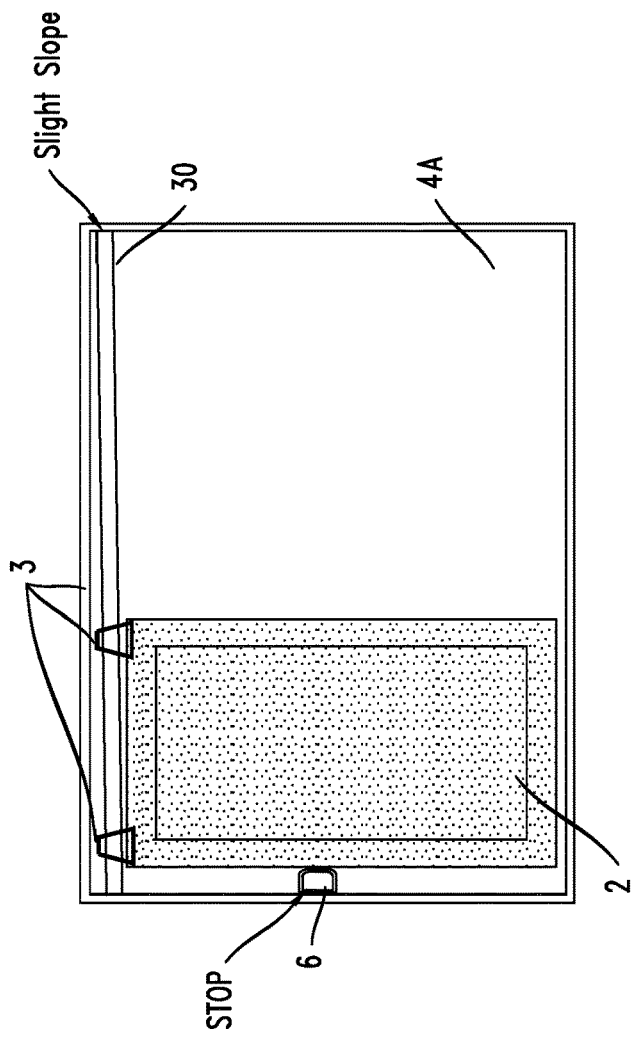
FIG. 3D depicts details of an exemplary closure system according to embodiments of the invention.

FIG. 3D depicts additional details of an exemplary first axis, closure control system. A stop 6 is shown. The stop 6 (with, or without control of a microcontroller, for example) may be used to provide additional positional control over the component 2. For example, as the component 2 is moved by system 3 in a first direction to cover an opening in the interior surface 4A of a wall of an enclosure the stop may function to stop or limit the further movement of the component 2 along one axis in a first direction, so that the component 2 aligns in its proper position along the first axis so that when a force is applied to the component 2 by a second axis, closure control system to move it slightly towards the interior surface 4A along a second axis (in a second direction), a seal of the opening is achieved. It should be understood that the dimensions (e.g., length and width) of a component 2 may be the same as a given opening in an enclosure or may be slightly larger to cover the opening. FIG. 3D also depicts the exemplary support rail 30 that functions to support the weight of the component 2 and as a guide along which the component 2 moves to cover and uncover the opening in the wall. As shown, in one embodiment the rail 30 may be configured or otherwise positioned on the interior surface 4A of a wall so that it is slightly sloped from one end to another (i.e., the rail is not level).

As will be discussed in more detail further herein, a second axis (e.g., z-axis) closure control system for moving the component in a second direction along a second axis may include a number of different elements, one of which is a bladder system as shown in FIG. 3E. The exemplary bladder system may include an inflatable/deflatable bladder 31A that may be fixed to one or more sides of the component 2. Referring back to FIGS. 1H and 1I, upon positioning of the component 2 adjacent an opening (i.e. by gliding) along in a first direction along a first axis ("x-axis"), and upon expansion (inflation) of the bladder 31A (using compressed gas, for example) a force may be exerted by the bladder 31A on "T" section 31E that is connected to component 2 to move the component 2 in a second direction along a substantially second axis (z-axis) towards the interior surface 4A of the wall to seal any opening or gap "$g_1$" between the component 2 and the internal surface 4A of the wall. The bladder system may further include a source of a gas 31B, compressor/pressure regulator 31C to compress gas from the source 31B and monitor its pressure and a pressurized line (or lines, collectively "line") 31D to transport the pressurized gas from the compressor 31C and source 31B to the inflatable bladder 31A. Alternatively, the pressurized line 31D may be connected to a gas storage tank (e.g., low pressure tank; not shown in FIG. 3E) before the line 31D is connected to the bladder 31A instead of connecting the line 31D directly to the bladder 31A in order to further regulate and store pressurized gas for proper operation of the bladder 31A.

In more detail, as illustrated in FIGS. 1H and 1I, as the bladder 31A inflates and applies a force against the T section 31E the T section compresses compression pad 31F an amount substantially equivalent to the length of gap 8 and/or until the component 2 compresses a compression probe a certain distance (see FIGS. 5A through 6C) indicating the component 2 has made compressible contact with gaskets 32 on the surface 4A and further indicative of the sealing or closing of the space 8 between the component 2 and interior surface 4A to prevent signals (or material) from entering or escaping the enclosure. As will be understood by those skilled in the art, the design depicted in FIGS. 1H and 1I functions to exert a substantial majority of the forces (e.g., stresses) used to move the component 2 on elements within the isolating frame structure 9 ("isolating frame") to prevent a substantial amount of force from being exerted on the component 2. This "internalization" of forces within isolating frame 9, as opposed to being exerted on component 2 (e.g., on a door), is believed to substantially reduce the amount of forces applied to, or exerted on, the component 2. Yet further, in the embodiments depicted in the figures, gaskets, such as gaskets 32, are configured only one opposing surface and not two opposing surfaces as is typical of existing systems and designs, Said another way, in embodiments of the invention no gaskets need be included and positioned on the component 2 as it comes in contact with gaskets on surface 4A to create a protective seal that functions to prevent signals (or material) from entering or escaping the enclosure. That said, it should be understood that the position of the gaskets 32 may be reversed—configured on the surface 4A and not on the component 2.

Referring to FIG. 4A there is shown a simplified diagram of the exemplary positioning of one or more sealing gaskets 32 on the interior surface 4A of a wall and substantially surrounding an interior opening 5A of an enclosure. In embodiments of the invention the one or more gaskets 32 may be configured concentrically with respect to one another as shown in FIG. 4B to substantially surround an opening 5A. Though FIG. 4B depicts the use of five concentric gaskets 32 (see the drawing on the left side of FIG. 4B), this is merely exemplary and fewer or more gaskets may be used depending on a particular design. Though concentric, each of the gaskets may overlap another gasket (e.g., by 4 inches) to provide an increase in environmental and electrical sealing. In an embodiment, the one or more gaskets 32 may be further positioned between the component 2 and the interior surface 4A of a wall of an enclosure (see the drawing on the right side of FIG. 4B), for example.

Not only may the number of gaskets vary, but the material used for a particular gasket may vary, Further, the cross-sectional shape of each gasket may vary. FIGS. 4C and 4D illustrate some exemplary shapes of gaskets 32a, b, c. It should be understood that although FIGS. 4C and 4D illustrate the location of gaskets 32a, b, c on one side of the opening 5A (on an interior wall surface 4A), that substantially similar gaskets may be located on the opposite side of the opening 5A as well (i.e., there are at least two sets of gaskets). To simplify our explanation, we will focus on just one set of gaskets it being understood that the explanation is substantially the same for gaskets on the opposite side. As seen in FIGS. 4C and 4D, the cross-sectional shape of a gasket may be rectangular as illustrated by gasket 32a, trapezoidal as illustrated by gasket 32b, a combination of circular and rectangular as illustrated by gasket 32c or circular to name just some of the many cross-sectional shapes of gaskets that may be used as a part of the inventive systems and methods. As for the materials used, some exemplary materials are a PORON foam, radio frequency (RF) hard core or an RF foam core to name just some of the many types of materials that may be used as gasketing material. Yet further, a foam gasket may be covered with a silver fabric, copper, silver or copper mesh, beryllium bronze, thin copper sheets, aluminum, or stainless steel. In embodiments of the invention, a particular gasket (and type, material) may be selected and used based on its specific attenuation performance at certain frequencies. That is to say, each of the gaskets 32 (or combination of gaskets) may be configured and composed to attenuate a different (or the same) frequency or range of frequencies. Further, the hardness of a foam gasket may be varied to optimize the compression pressure between the component 2 and surface 4A. Still further, in CBR applications the gasketing material may comprise an ethylene propylene diene monomer rubber.

In more even detail, concentric gaskets 32b may be configured to function co-operatively, such as in series from an attenuation perspective. For example, the attenuation performance of each gasket 32 may be affected by the performance of one or more of the other gaskets 32. Further, for different applications a different combination of gasket types may be used. For example, if a signal to be attenuated is only between 1 GHz and 10 GHz the gasket 32 (or combination of gaskets) that is best adapted to attenuate or otherwise adversely interfere with such frequencies may be used. In existing modular TEMPEST enclosures, the least secure point (from an electromagnetic eavesdropping point of view) is typically the door (door seal). In contrast, lightweight glidable shielded components provided by the present invention are believed to provide protection substantially similar to a solid, shielded wall panel that is part of an accredited enclosure.

In embodiments, one or more of the gaskets 32 may function to provide CBR protection. In comparison, existing systems that sometimes use Beryllium bronze "knife and spring" gaskets do not provide CBR protection (the use of Beryllium bronze maybe banned in some countries).

The material used for each gasket may vary depending on the amount of compression force that will be applied to each gasket by the component 2, for example. In more detail, a PORON extra soft material may be used which typically requires a compression force of 1.4 psi to compress the gasket by 25%. It should be understood that the compression force will vary (increase, for example to compress a gasket by 40%, or decrease) depending on the type of material used for each gasket (e.g., for an EMI gasket the force may be less). The length of a complete gasket 32 may be sufficient to substantially, completely surround an opening in an enclosure. In one embodiment, the total length may be 216 inches (73 inches for each vertical dimension, and 35 inches for each horizontal dimension), to name just one of many possible sized gaskets. Further, as shown in FIG. 4B the gaskets 32 may be positioned close to one another. In one embodiment, each of the gaskets 32 may be 0.375 inches in width, and may be positioned so that there is little or no space between each gasket (unlike what is shown in FIG. 4B). It should be noted again that the dimensional information herein is merely exemplary.

Referring now to FIGS. 5A through 5C there is depicted a simplified drawing of the positioning and operation of an interlocking switch 37 that may be part of the second axis, closure control system. In one embodiment, the switch 37 may be positioned on the interior surface 4A of an enclosure wall along with gaskets 32. Upon activation of the bladder 31A a force may be exerted on the component 2 to force the component 2 towards the surface 4A. As the component 2 is forced towards the surface 4A and gaskets 32, it makes contact with the switch 37 that begins a depression or the application of a force onto compressible probe 38 that is a part of switch 37. Depending on a desired setting, once the probe 38 has been contacted and moved a certain distance (i.e., depressed inwards) the switch 37 may be operable to generate a signal indicating the component 2 has made contact with surface 4A or near contact with surface 4A and further indicative of the sealing or closing of the space 8 between the component 2 and interior surface 4A to prevent signals from entering or leaving the enclosure. The switch 37 may be positioned anywhere along the interior surface 4A so long as its position makes it possible to reliable detect movement of the component 2 towards the surface 4A. In the embodiment depicted in FIG. 5C the switch 37 is positioned at a point "P" that is adjacent to the lower corner of opening 5A though this is just one of many possible positions for the switch 37. As positioned at point "P" the switch will be in a position to be contacted by the component 2 as it moves towards surface 4A to seal or otherwise close off space 8 and opening 5A.

Referring now to FIG. 6A there is shown an exemplary electromagnetic coupling system that may be part of a second-axis, closure control system. The coupling system may comprise one or more magnets 39A (collectively ("magnet") and a ferromagnetic component 39B (e.g., iron) located on one side of the component 2 and interior wall surface 4A of the enclosure, it being understood that a substantially similar components 39A',39B' are also included in the coupling system and are located on the opposite top side of the component 2 and on the opposite interior wall surface 4A (i.e., the surface on the other side of the opening 5A—not shown in figures; i.e., there are at least two pairs of magnets). To simplify the explanation of the operation of the magnets, we will focus on the operation of one pair, 39A,39B, it being understood that the operation of the other pair of magnets 39a',39B' on the opposite top side/interior wall surface is substantially the same. Together one pair of magnets may be referred to as an "electromagnetic assembly".

The electromagnetic coupling system may (or may not) be used in conjunction with other elements (e.g., bladder 31A) to ensure that the component 2 is sufficiently in contact with the interior wall surface 4A of the enclosure to form an effective seal and closure of space 8 and opening 5A. In FIG. 6A, the electromagnetic assembly 39A,39B has not been activated (not in operation), while in FIG. 6B the electromagnetic assembly 39A, 39B has been activated. As shown in FIG. 6B, in an embodiment of the invention, once the component 2 has moved towards the surface 4A in the second direction along the second axis (by, for example, a force being exerted upon it by magnets 39A, 39B and/or a bladder assembly explained elsewhere herein) it reaches a point where the electromagnetic field of the magnet 39A interacts with the ferromagnetic component 39B to create attractive forces that are exerted on the component 2 to force the magnet 39A and component 39B to become attracted to one another, which in turn, further forces the component 2 towards gaskets 32 on the interior wall surface 4A. The result is a seal or closure of the space 8 and opening 5A that prevents signals or material from entering or exiting the enclosure along all axes.

Figure 6C:
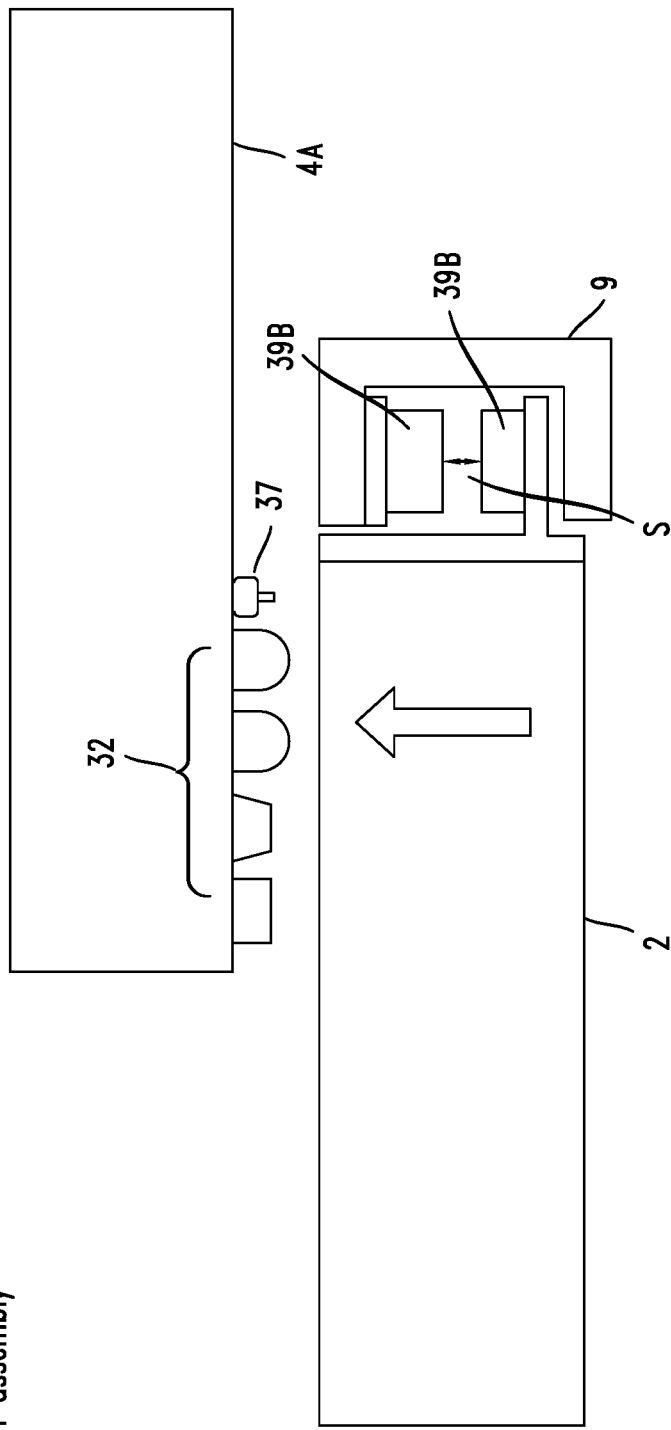
FIG. 6C depicts other electromagnet components according to another embodiment of the invention.

FIG. 6C depicts an alternative location for the electromagnetic assembly 39A,39B. Instead of locating the assembly 39A,39B on the interior surface 4A of the enclosure wall and component 2 (e.g. door 2), the assembly 39A,39B (or parts thereof) may be located within an isolating frame 9 of the component 2. As shown, the component 2 is located within the frame 9 such that there is a space "S" between the magnet 39A and ferro-magnet 39B. As the component 2 (which may be connected or hinged at the top using fasteners, such as fasteners 3B in FIG. 1B—not shown in FIG. 6C) moves towards the surface 4A (by, again, via a force exerted upon it by a bladder assembly, for example) and at the same time towards magnet 39A, it reaches a point where the electromagnetic field of the magnet 39A interacts with the ferro magnetic component 39B to create attractive forces that are exerted on the component 2 to further force the magnet 39A and component 39B together, which in turn, further forces the component 2 towards gaskets 32 and compression probe 38 on the interior wall surface 4A. The result again is a seal or closure of the space 8 and opening 5A that prevents signals from entering or exiting the enclosure. It should be understood that the distance (or length) "S" between magnets 39A, 39B traveled by magnet 39B may be substantially equal to the length of gap 8 between gaskets 32 and component 2 indicative of a distance the component 2 may travel to seal or close the space 8 between the component 2 and interior surface 4A to prevent signals (or material) from entering or escaping the enclosure.

Similar to the discussion of the embodiments depicted in FIGS. 1H and 1I, as will be understood by those skilled in the art, the design depicted in FIG. 6C functions to exert a substantial majority of the forces (e.g., stresses) used to move the component 2 on elements 39A, 39B that are within the isolating frame 9 to prevent a substantial amount of force from being exerted on the component 2. This "internalization" of forces within structure 9, as opposed to being exerted on component 2 (e.g., on a door), is believed to advantageously reduce the amount of forces on component 2. Yet further, in the embodiments depicted in the figures, gaskets, such as gaskets 32, are configured only one opposing surface (e.g., surface 4A) and not two opposing surfaces as is typical of existing systems and designs, Said another way, in embodiments of the invention no gaskets need be included and positioned on the component 2 as it comes in contact with gaskets on surface 4A (or vice-versa) to create a protective seal that functions to prevent signals (or material) from entering or escaping the enclosure.

Similar to above, it should be noted that the FIG. 6C shows only one of two electromagnetic assemblies 39A, 39B, where a substantially similar assembly is located on the opposite top or corner of the component 2 (i.e., there are at least two electromagnetic assemblies). To simplify the explanation of the operation of the assembly, the above explanation focused on the operation on one of the assemblies, it being understood that the operation of the assembly on the opposite top side or corner is substantially the same.

Figure 9A:
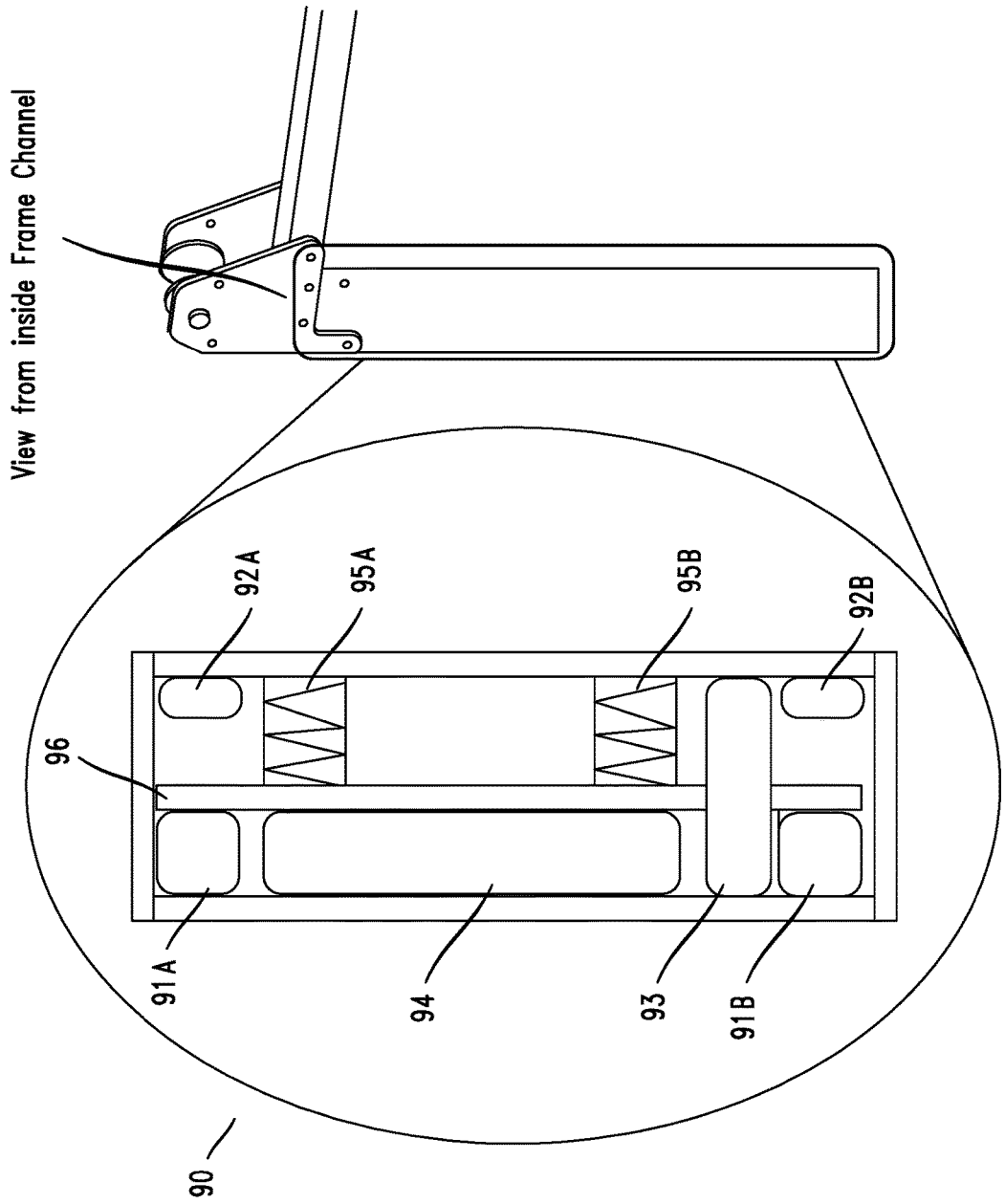

It should be understood that electromagnetically coupling is not the only means to move component 2 in a second direction along a second axis to close an opening in an enclosure. For example, referring now to FIG. 9A there is depicted a side view of another embodiment of a second axis, closure control system that comprises a combination of an electromagnetic and pneumatic closure system 90. As depicted system 90 may comprise electromagnetic assembly 91A,92A, 91B, 92B, pneumatic air pump 93 (e.g., micro-air pump), inflatable bladder 94, compressible members 92A, 92B (e.g., springs). In embodiments of the invention the electromagnetic assembly 91A,92A, 91B, 92B may comprise electromagnets 91A,91B operable to reverse their magnetic poles and permanent magnets 92A,B. In an embodiment the system 90 may operate similar to the closure systems depicted in FIGS. 1H and 1I but, in addition, the air pump 93 may be operable to assist in the movement of L channel 96 that is connected to component 2 (not shown in FIG. 9A) towards an interior wall 4A (not shown in FIG. 9A).

Referring now to FIG. 9B there is depicted a side view of yet another embodiment of a second-axis, closure control system 900. As depicted system 900 may comprise cam assembly 901A,B linear actuators 902A,B and compressible members 903A,B (e.g., springs). In embodiments of the invention, as the actuators 902A,B are supplied power (e.g., from an electrical power source, such as an uninterruptible power supply (UPS)) pistons 904a,b that are a part of the actuators 902A,B exert forces on the respective cam assemblies 901A,B and, in turn, the L channel 905 that is connected to component 2 (component 2 not shown in FIG. 9B), the net effect being that the L channel 905 and component 2 move towards an internal wall 4A (not shown in FIG. 9B) to a closed position. Conversely, as power is removed from the actuators 902A,B the force of the compressible members 903A,B (e.g., return springs) forces the L channel 905 (and component 2) back in the opposite direction (i.e., to an open position).

FIG. 9C depicts a similar closure system as in FIG. 9B except that the cam assemblies 901A,B in FIG. 9B have been replaced with hinge pin structures 901c,d and 901e,f. In embodiments of the invention, as the actuators 902A,B are supplied power (e.g., from an electrical power source, e.g., an AC power source or an UPS) pistons 904a,b that are a part of the actuators 902A,B exert forces on the respective cam section 901c,e of a respective hinge pin, in turn, the L channel 905 that is connected to component 2 (component 2 not shown in FIG. 9C), the net effect being that the L channel 905 and component 2 move towards an internal wall 4A (not shown in FIG. 9C) to a closed position. Conversely, as power is removed from the actuators 902A,B the force of the compressible members 903A,B (e.g., return springs) forces the L channel 905 (and component 2) back in the opposite direction (i.e., to an open position). In this embodiment, the force needed by the compressible members 903A,B to move the L channel 905 and component 2 (e.g., door) back to an open position (or closed position depending on the design of a system) may be less than that needed by the embodiment depicted in FIG. 9B because the forces are a combination of vertical and horizontal in FIG. 9C, whereas the forces are substantially horizontal in FIG. 9B and, therefore, may require additional force especially during a loss of power.

Figure 9D:
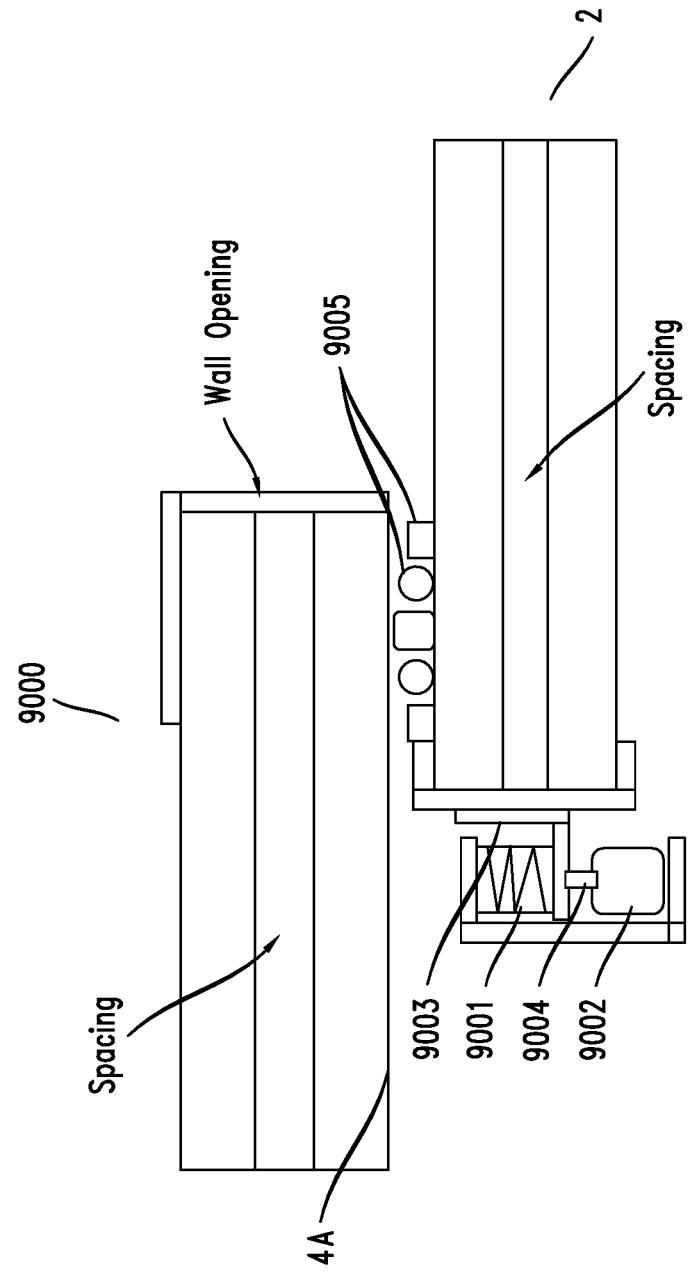

Referring now to FIG. 9D there is depicted a top view of yet another embodiment of a second-axis, closure control system 9000. As depicted system 9000 may comprise pneumatic piston or air cylinder 9002 and compressible member 9001. In an embodiment, the upon receiving a source of power (e.g., from a small air compressor, not shown in FIG. 9D) air cylinder 9002 functions to exert a force on "L" channel 9003 (e.g., fiberglass channel) that may be connected or mounted to component 2. As a piston 9004 of the air cylinder 9002 exerts a force of the "L" channel this causes the component 2 (e.g., door) to move towards the internal surface 4A of the wall. In more detail, the force exerted on the L channel compresses a return spring 9001 while at the same time forcing the lightweight, glidable shielded component 2 into the internal surface 4A of wall. Further, the movement of the component 2 into the internal surface 4A functions to compress the conductive gaskets 9005, that are configured to be connected to the component 2 in this embodiment, thereby creating a continuous electromagnetic and CBR seal between the surface 4A and component 2 (i.e., of a closed position). Conversely, when the component 2 is to be opened, power may be removed from the air cylinder 9002 thus allowing the force of the return spring 9001 (or other functionally equivalent structure) to overcome the reduced force of the air cylinder 9002 to force the L channel 9003 in the opposite direction, and, force the component 2 in the opposite direction and away from the internal surface 4A of the wall (i.e., to an open position).

In the embodiment depicted in FIG. 9D the gaskets 9005 are depicted connected to the component 2. The reader may notice that in other embodiments described herein the gaskets are connected to the internal surface 4A of the wall and not the component 2. Accordingly, it should be understood that the gaskets may be placed on either one of component 2 or internal surface 4A.

As can be realized from the discussion above the components provided by the present invention, such as component 2, may be operable to move in two distinct paths or axes to seal an opening in an enclosure: (a) one path or direction along a first axis that covers opening 5A, and a second, different path or direction along a second axis that covers space 8. In a three-dimensional Cartesian co-ordinate system where "x" denotes a horizontal path from left to right, "y" denotes a vertical path (up and down) and "z" denotes a horizontal path "in and out (or front to back)" it can be said that the components provided by the present invention are operable to move substantially along the x and z axes. FIGS. 7A to 7C provide a simplified illustration of the movement of the component 2 along an x axis and then along a z axis. For example, beginning with FIGS. 7A and 7B, upon supplying power to the first axis, closure control system (e.g., drive system), the component 2 is shown moving right to left (though this could be reversed) in a first direction along the x axis towards stop 6. In embodiments of the invention the drive system working in conjunction with the roller assembly, among other elements/structure, may be operable to so move the component 2 in the first direction along the x-axis ("first axis"). Upon reaching a desired position or upon traveling a desired distance the component 2 (as detected by stop 6, e.g., combination of detector and signal generator and/or a controller operable to control the motor assembly and receive a detection signal from the stop 6 indicating the position of the component 2 or estimate the expected travel distance of the component 2 based on a pre-programmed set of test data, for example) may cease to move in the first direction. In embodiments of the invention, the controller may be a microcontroller or a PLC and may be part of an overall control system (not shown in figures) that may be further operable to control, for example, the activation of the drive system used to move a component 2 left or right along one axis, and/or components of a second-axis closure control system (e.g., a bladder assembly discussed elsewhere herein) to move the component 2 forwards and backwards in a second direction along a second axis. For example, as explained elsewhere herein, if a bladder is used, then as the bladder 31 inflates it ultimately functions to cause the component 2 to move in a second direction along the z-axis towards the interior wall surface 4A. Upon moving a particular distance, a force may optionally be applied to the component 2 at least along the z axis ("second axis") by the assemblies 39A,39B,39A',39B' (not shown in FIGS. 7A to 7C) or by other second-axis, closure control systems depicted in FIGS. 9A to 9D prior to the component 2 making contact with the interlocking switch 37. In an alternative embodiment, the force applied by the assemblies 39A,39B, 39A', 39B' or by other second-axis, closure control systems depicted in FIGS. 9A to 9D may be applied after the component 2 makes contact with the interlocking switch 37. In any event, once the component 2 has moved a required distance in the second direction along the z axis the component 2 effectively closes the space 8 and opening 5A forming an electromagnetic seal along both the x and z axes among other types of seals to prevent signals from entering or escaping the enclosure. For added security, a handle and cam lock assembly may be attached to the interior surface of the component 2 (but does not penetrate the opposite outer surface) to allow a person in-side the enclosure to move the component 2 when necessary to close or open the component 2.

In sum, a first-axis, closure control system moves the component 2 in a first direction along a first axis to a position that covers an opening in an accredited enclosure. Once positioned, a second-axis, closure control system (such as those described with regards to FIGS. 1H, 1J, 9A to 9D) moves the positioned component 2 in a second direction along a second axis to form a seal in the opening of the accredited enclosure.

Enclosures provided by the present invention may include internal and/or external control panels, associated input/output devices within the panel, communication and power conductors connected to the panel and run throughout the enclosure, necessary transmitters, receivers, wiring (electrical or optical or wireless) as well as control circuitry/motion controllers connected to the input/output devices for receiving and sending signals between the input/output devices and other elements of the invention described elsewhere herein (e.g., to the motor assembly, roller assembly, bladder assembly, magnetic assembly, etc.). For example, an internal control panel may be mounted inside the enclosure on one of the interior walls 4A of the enclosure. Alternatively, some or all of the functions of the control panel may be portable (e.g., brought into the enclosure on a laptop or another control device and connected to circuitry and wiring in the enclosure). Some of the functions controlled by the internal control panel, circuitry and controller may be to: control the movement of the component 2, present a display of the date and time that the component 2 was last moved (e.g., opened) and store data related to each date and time the component 2 (and individual involved in) was moved (opened and closed), provide a display that presents images captured by security cameras inside and outside of the enclosure, display the external and internal temperatures, humidity and other environmental conditions, present indicators that are connected to monitors and alarms for indicating the presence of (or level of) hazardous chemicals, biologicals and radioactive materials within or without of the enclosure, provide for control of one or more cameras or other video/imaging devices that may be positioned inside an enclosure, or outside of the enclosure (on an external surface of the enclosure or elsewhere), provide for control of audio equipment, (e.g., an audio (intercom-like) communication switch and associated circuitry for transmitting and receiving audio signals from/to the inside of the enclosure), display a "Do Not Disturb" notice upon activation by an individual inside or outside of the enclosure, provide a display for presenting messages that may be received or transmitted from/to the enclosure from individuals inside or outside of the enclosure, provide an input device (key board, touch screen, retina scanner, fingerprint scanner, etc.) for inputting security codes, or for scanning an individual's retina or finger all of which may be sent to a controller (motion controller) that confirms the authentication of the individual and authorizes the individual to access (or not access) the enclosure, provide a display for indicating signals received from motion sensors inside or outside the enclosure, and provide a plurality of connections and interconnections (e.g., fiber optic connections, AC/DC power connections for a range of voltages and current, USB, blue tooth, IEEE 802.11) to allow an individual inside the enclosure to plug-in or otherwise adapt a device inside the enclosure for communications within the enclosure or for communications between himself/herself and those outside the enclosure.

Figure 8:
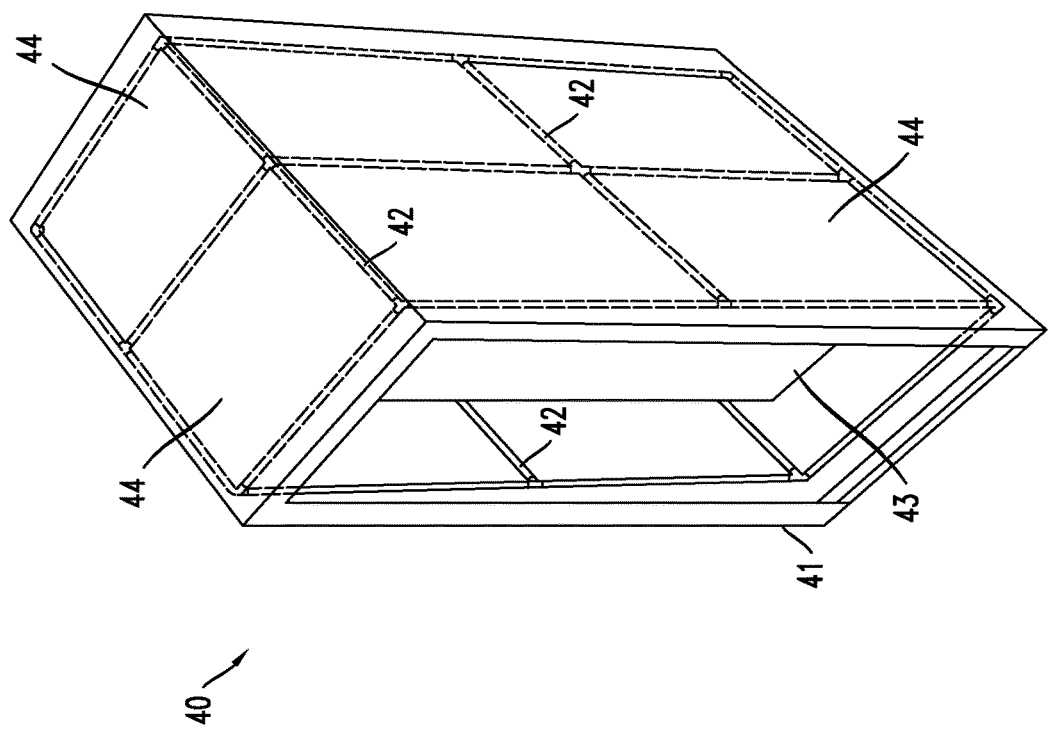
FIG. 8 depicts an exemplary radio acoustic mobile shelter according to an embodiment of the invention.

Referring now to FIG. 8 there is depicted an exemplary radio acoustic mobile system 40 according to an embodiment of the invention. As depicted the system 40 may comprise a single accredited enclosure 41 or two (or more) enclosures 41, 43. The second enclosure 43 may be of the type discussed earlier (e.g., enclosures 100 or 100) or an enclosure described in the '401 Application, to name just some of the many different types of enclosures. The enclosure 41 may comprise a plurality of lightweight and flexible, yet rigid, support structures or ribs 42 for supporting a covering 44. The covering 44 may comprise a plurality of layers (e.g. fabric layers). For example, in one embodiment the covering 44 may comprise an inner RF shielded layer made from one or more materials (e.g., fabrics) and an outer acoustical suppression layer or barrier (hereafter "layer") where the layers are separated by an air passage or layer. It should be understood that each layer may further comprise a plurality of additional integral layers. For example, the number of additional integral layers comprising the acoustical layer may be adjusted to achieve a desired acoustical or sound suppression level (e.g., a sound transmission class rating of 45 or better). Or, for example, the number of additional layers comprising the RF shielded layer may be adjusted to achieve a desired RF signal attenuation.

In additional embodiments, the acoustical layer (or layers) may comprise one or more sound isolation materials, structures or configurations such as sound absorption materials (e.g., fiberglass, blow-in cellulose, mineral fibers), or adding additional mass (layers) to a layer. The air layer or passage may function as a decoupling layer to structurally decouple the other layers from one another and from the source of any sound inside or outside of the enclosures 41, 43. Yet further, sound damping tape and other materials may be applied to a layer or layers to reduce both vibration and sound transmission (see for example, https://en.wikipedia.org/wiki/Sound_transmission_class).

Still further, the radio acoustic mobile system 40 may comprise additional acoustic and vibrational treatment systems. For example, one or more integral passive layers making up the covering 44 may be combined with an active sound suppression system (not shown in FIG. 8) that generates soundwaves in particular patterns to further suppress sounds that emanate from the interior or exterior of the enclosures 41, 43. In addition, the suppression of sound may have an advantageous effect on individuals utilizing audio equipment (e.g., headphones) within the enclosures 41, 43.

In embodiments of the invention, the closure components and systems described previously herein (e.g., components 2, 3, 30 to 39B') may be made a part of the enclosures 41, 43 depicted in FIG. 8. Thus, an overall system may be lightweight yet provide a great deal of improved RF, CBR and acoustical protection/suppression over existing systems.

Again, as discussed above it should be understood that the dimensions, weights, shapes, designs, performance, frequencies and positions described herein and/or shown in the figures herein, are merely exemplary, and may be changed to fit a specific application/use/environment.

The description above provides some examples of the scope of the present invention that fall within the numbered claims that follow. It is not intended to be an exhaustive description of the many examples of the claimed inventions. Such a description would be impractical to write. Variations of the examples given within are considered to be within the scope of the claim of the present invention. For example, rather than use a lightweight, glidable shielded closure component (e.g. door) the component may comprise material that increases the weight of the component. In such an embodiment, one or more wheel assemblies may be connected to the bottom of such a component to aid in the movement of the component (i.e., to open or close the door).

Further, it should be understood that additional structure may be used with the systems, structures, components and elements described herein but for the sake of clarity these are not described herein because they are also well known to those skilled in the art. For example, one or more of the glidable, shielded components and/or closure systems described herein may be combined with, or be configured to be connected to or used with, an existing SCIF, TEMPEST SCIF or TWSA structure or room (e.g., to replace a pre-existing door) or combined with, or be configured to be connected to or used with, an existing or newly designed shielded, architectural structure (room within a building, building) or with lightweight enclosures such as those described in U.S. Pat. No. 8,872,042, for example. In such embodiments it should be understood that combining or connecting inventive components or systems with existing or newly designed structures may require the use of specialized interfaces for such combinations and connections.

The inventive lightweight, glidable shielded components and associated accredited enclosures are believed to provide increased electromagnetic attenuation performance over existing systems without the need to use existing mechanically complex and bulky systems. The simplicity and modular design of the inventive components and enclosures allow for easy and quick installation by one or two installers, for example, in a facility which is not equipped with freight elevators or special maintenance stair cases that is sometimes required by existing systems. Due to their lightweight, installers can completely install an inventive component or enclosure, moving such from a delivery vehicle to the installation location in a short time. No forklifts, carts, gantries, freight elevators are needed. This is particularly attractive when installation is required within an existing (old) facility that does not have the access required to install existing doors or enclosures.

Further, the floors of a particular installation may not have been constructed to support the heavy weights or loads that are associated with existing doors, components and enclosures. Sometimes an architectural analysis of such a floor may be required in order to determine what load a floor can support. Such problems are eliminated by use of the inventive components and enclosures due to their modular and lightweight designs.

Due to their lightweight and modular design, inventive components, elements and systems can be easily replaced or exchanged by a single person. For example, it is believed that many components, elements and sub-systems may be replaced in less than ½ an hour by a SCIF authorized user.

In addition, maintenance of the inventive components, elements, enclosures and systems is believed to be simplified when compared to existing systems. For example, the training of maintenance personnel is straightforward due to the design (features and functions) of the inventive components and enclosures. This reduces the need for specialized maintenance personnel to travel to an installation.

Further, the features and functions of the inventive components, enclosures and systems make it highly likely that the attenuation/protection performances can be maintained even after installation which is unlike existing systems where such performance is degraded due to the use of complex, bulky and heavier components to complete the installation of an existing system (e.g., door or enclosure).

Still further, often the performance of existing systems (e.g., attenuation requirements) degrades over time as the system is subjected to variations in temperature, hygrometry or physical change such as mild earthquakes or vibrations. In contrast, the performance of inventive components, enclosures and systems can be maintained due to their inventive features and functions.

During the closing or opening of an inventive, lightweight glidable shielded component 2 the component may be moved along an axis (e.g., horizontal axis) parallel to an interior wall of an enclosure wall that is does not come in contact with. The component is moved until it is adjacent to an opening in the enclosure. It should be noted that the center of the component (e.g., door) need not be precisely aligned with the center of the opening because the component may be dimensionally larger than the opening. This absence of precision allows the component (door) to maintain a high level of protection during the life of the enclosure as the component is continually moved (opened and closed) to seal the opening as compared with existing systems which require precise alignment, and where such an alignment becomes unachievable over time due to wear and tear on the much heavier and bulky components.

What is claimed is:

1. An accredited enclosure comprising:
a lightweight, glidable shielded component;
a drive system for moving the component in a first direction parallel to a rail to a position that covers an opening in the accredited enclosure; and
a closure control system for moving the component in the second direction to seal a gap between the component and a surface of a wall of the accredited enclosure, the closure control system comprising an isolating frame structure that prevents a substantial amount of force from being exerted directly on the component.

2. The closure system as in claim 1 further comprising:
a rail located at or above a top edge of the component; and
a roller assembly connected to a top edge of the component and the rail.

3. The closure system as in claim 1 wherein the drive system comprises a coupling system.

4. The closure system as in claim 3 wherein the coupling system comprises a modified Halbach array.

5. The closure system as in claim 1 wherein the component comprises one or more integral layers of a lightweight shielding material and a dielectric material.

6. The closure system as in claim 1 wherein the component comprises one or more integral layers of a ballistic material.

7. The closure system as in claim 1 wherein the component is configured to attenuate one or more electromagnetic frequencies over the range of 20 MHz to 18 GHz.

8. The closure system as in claim 1 wherein the component is configured to provide 40 dB of passive sound attenuation.

9. The closure system as in claim 1 wherein the closure control system comprises an inflatable bladder for exerting a force on elements of the isolating frame structure.

10. A method for closing an accredited enclosure comprising:
using a drive system to move a lightweight, glidable shielded component in a first direction parallel to a rail to a position that covers an opening in the accredited enclosure;
using a closure control system to move the component in a second direction to seal a gap between the component and a surface of a wall of the accredited enclosure; and
using an isolating frame structure that prevents a substantial amount of force from being exerted directly on the component.

11. The method as in claim 10 wherein the drive system comprises a coupling system.

12. The method as in claim 11 wherein the coupling system comprises a modified Halbach array.

13. The method as in claim 10 wherein the component comprises one or more integral layers of a lightweight shielding material and a dielectric material.

14. The method as in claim 10 wherein the component comprises one or more integral layers of a ballistic material.

15. The method as in claim 10 further comprising attenuating one or more electromagnetic frequencies over the range of 20 MHz to 18 GHz using the component.

16. The method as in claim 10 attenuating 40 dB of passive sound using the component.

17. The method as in claim 10 further comprising positioning the component within the accredited enclosure.

18. The method as in claim 10 further comprising positioning the component outside the accredited enclosure.

* * * * *